US010527897B2

(12) United States Patent
Ishigaki et al.

(10) Patent No.: US 10,527,897 B2
(45) Date of Patent: Jan. 7, 2020

(54) DISPLAY DEVICE WITH PARTITION BETWEEN COLOR FILTERS

(71) Applicant: Japan Display Inc., Minato-ku (JP)

(72) Inventors: Toshimasa Ishigaki, Tokyo (JP); Osamu Itou, Tokyo (JP)

(73) Assignee: Japan Display Inc., Minato-ku (JP)

(*) Notice: Subject to any disclaimer, the term of this patent is extended or adjusted under 35 U.S.C. 154(b) by 0 days.

(21) Appl. No.: 15/784,462

(22) Filed: Oct. 16, 2017

(65) Prior Publication Data

US 2018/0107078 A1 Apr. 19, 2018

(30) Foreign Application Priority Data

Oct. 19, 2016 (JP) ................... 2016-205134

(51) Int. Cl.
*G02F 1/1362* (2006.01)
*G02F 1/1335* (2006.01)
*H01L 27/12* (2006.01)
*G02F 1/1333* (2006.01)
*G02F 1/1343* (2006.01)
*G02F 1/1368* (2006.01)
(Continued)

(52) U.S. Cl.
CPC ...... *G02F 1/136209* (2013.01); *G02F 1/1368* (2013.01); *G02F 1/13439* (2013.01); *G02F 1/133345* (2013.01); *G02F 1/133514* (2013.01); *G02F 1/134309* (2013.01); *G02F 1/136286* (2013.01); *H01L 27/124* (2013.01); *H01L 27/1222* (2013.01); *H01L 27/1248* (2013.01); *H01L 27/1288* (2013.01); *H01L 29/1054* (2013.01); *H01L 29/78633* (2013.01); *H01L 29/78645* (2013.01); *G02F 2001/134372* (2013.01); *G02F 2001/136222* (2013.01); *G02F 2201/121* (2013.01); *G02F 2201/123* (2013.01); *H01L 27/1225* (2013.01); *H01L 29/7869* (2013.01); *H01L 29/78666* (2013.01); *H01L 29/78675* (2013.01)

(58) Field of Classification Search
CPC ......... G02F 1/136209; G02F 1/136286; G02F 2001/136222; G02F 1/133514; H01L 27/1248
USPC .............................................. 257/72, 89, 98
See application file for complete search history.

(56) References Cited

U.S. PATENT DOCUMENTS 7,586,555 B2* 9/2009 Lee ...................... G02F 1/13394
349/106
2008/0036367 A1* 2/2008 Eida ...................... H01L 27/322
313/504
(Continued)

FOREIGN PATENT DOCUMENTS

JP 2016-14778 1/2016

*Primary Examiner* — Robert T Huber
(74) *Attorney, Agent, or Firm* — Oblon, McClelland, Maier & Neustadt, L.L.P.

(57) ABSTRACT

According to one embodiment, a display device includes an insulating substrate, a light-shielding member disposed above the insulating substrate, a first color filter disposed above the insulating substrate, a second color filter disposed alongside the first color filter, a partition disposed on the light-shielding member and between the first color filter and the second color filter and an insulating film disposed on the first color filter and the second color filter, and an upper surface of the partition and an upper surface of the insulating film are located on a same plane.

12 Claims, 16 Drawing Sheets

(51) Int. Cl.
*H01L 29/786* (2006.01)
*H01L 29/10* (2006.01)

(56) References Cited

U.S. PATENT DOCUMENTS

2016/0004135 A1 1/2016 Nakao et al.
2017/0139299 A1 5/2017 Nakao et al.

* cited by examiner

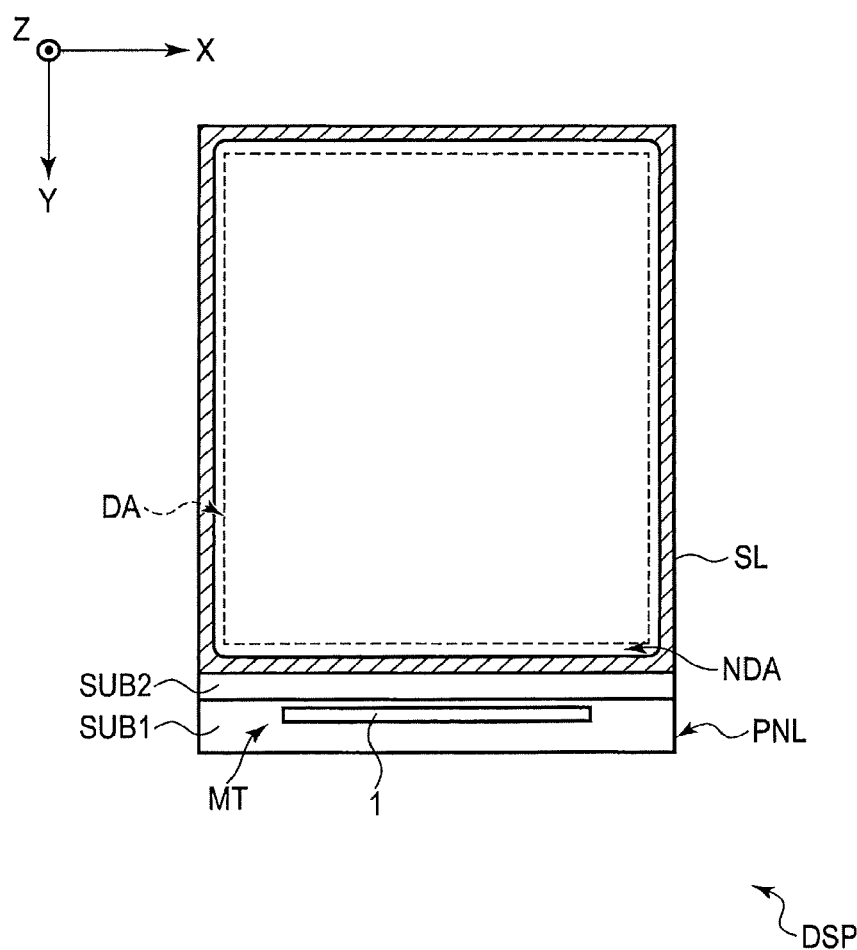
F I G. 1

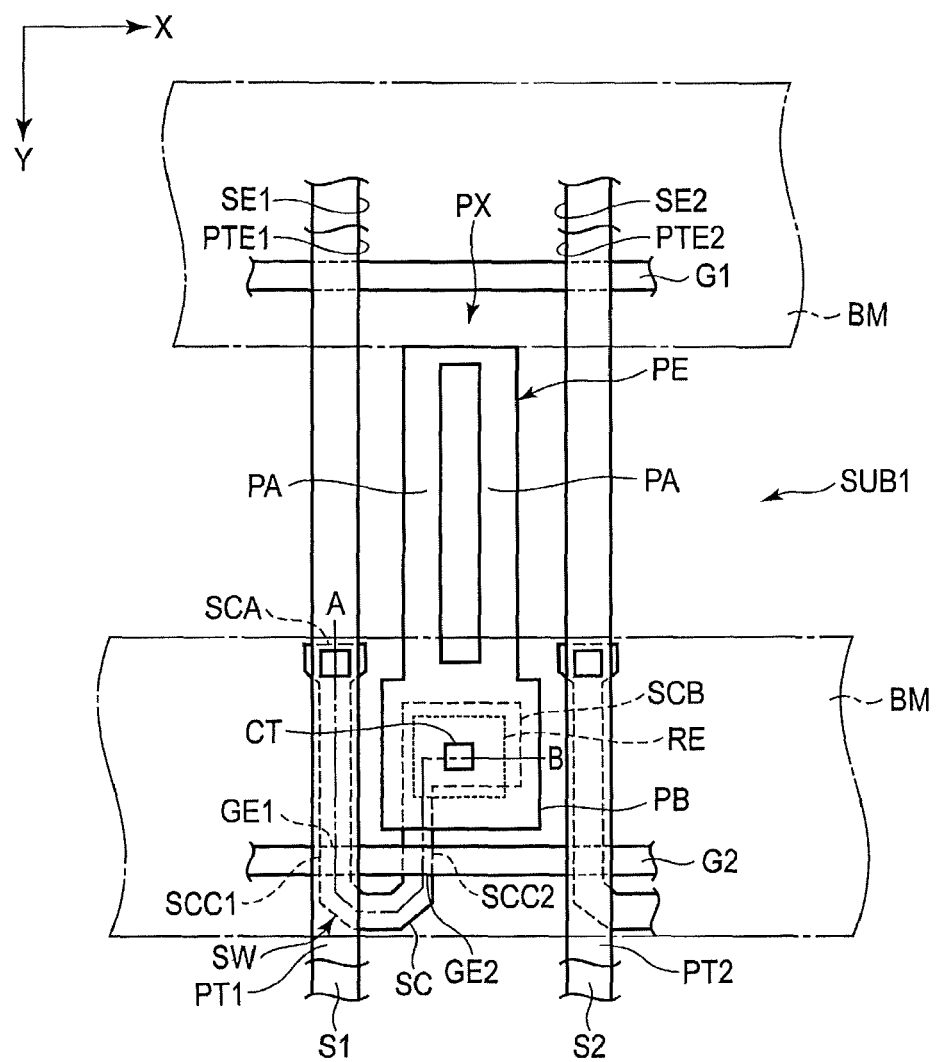
F I G. 3

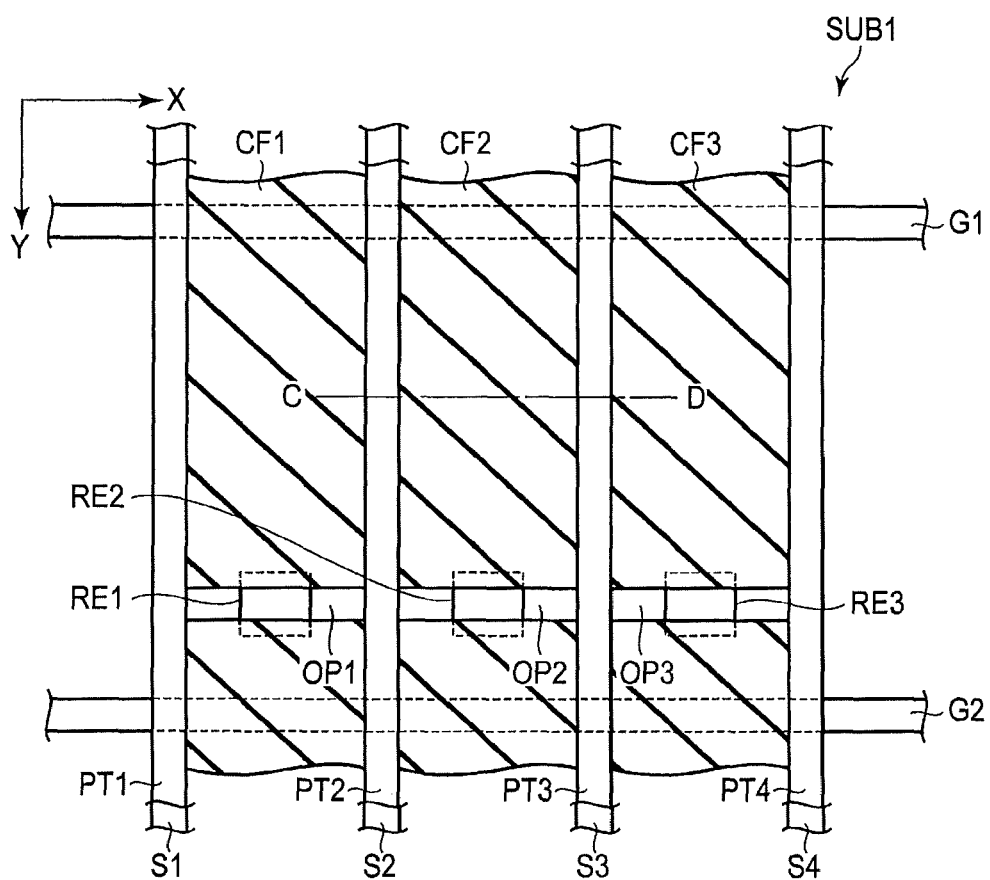
F I G. 5

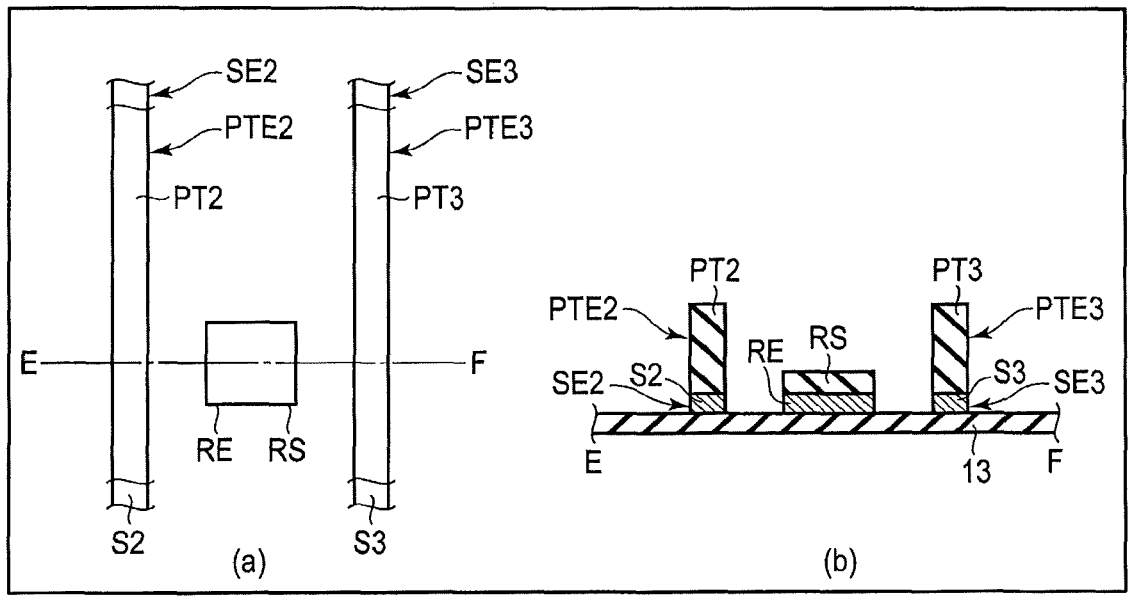
F I G. 9
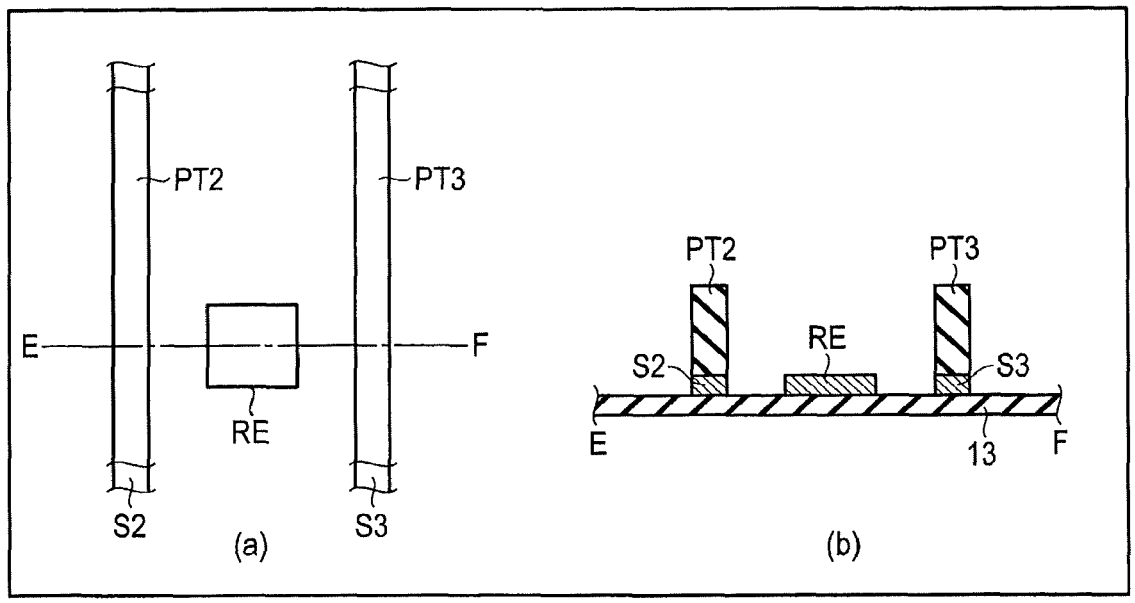
F I G. 10

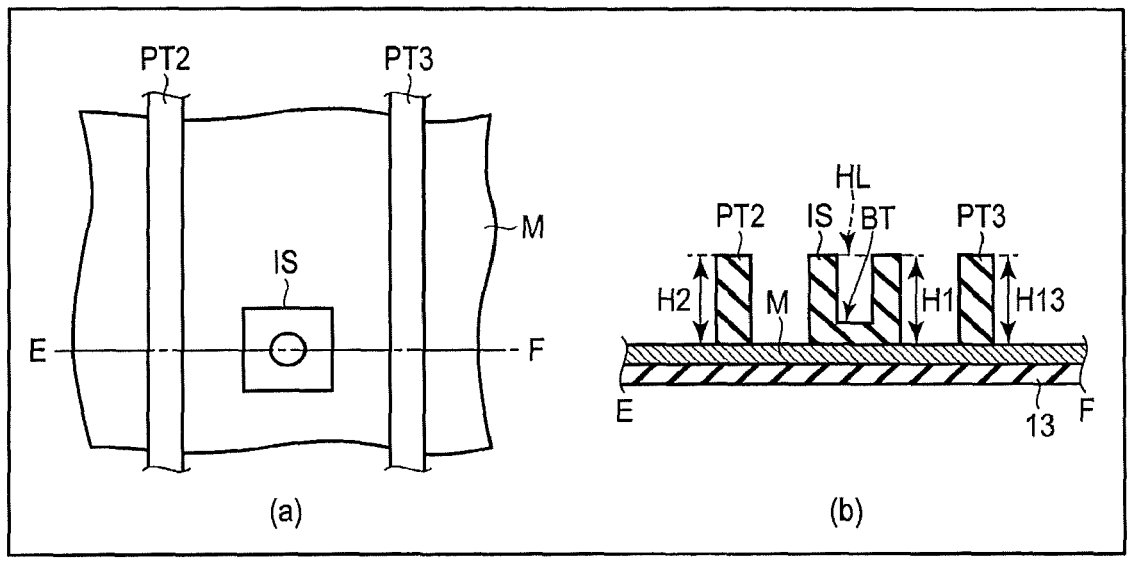
F I G. 13
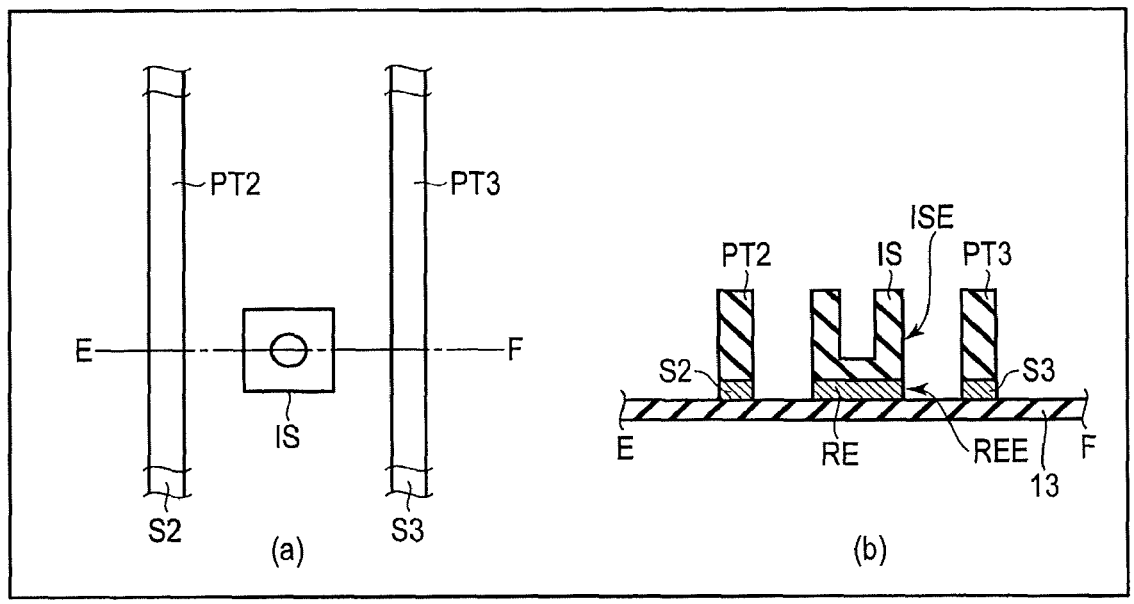
F I G. 14

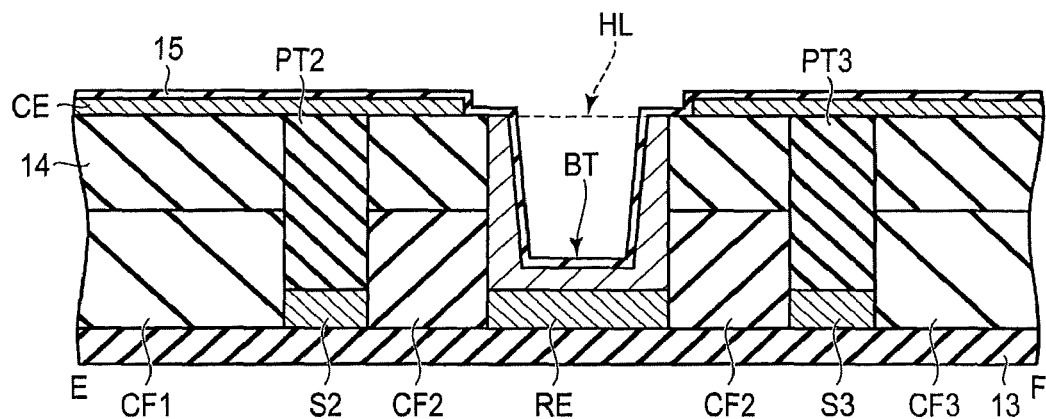
F I G. 17
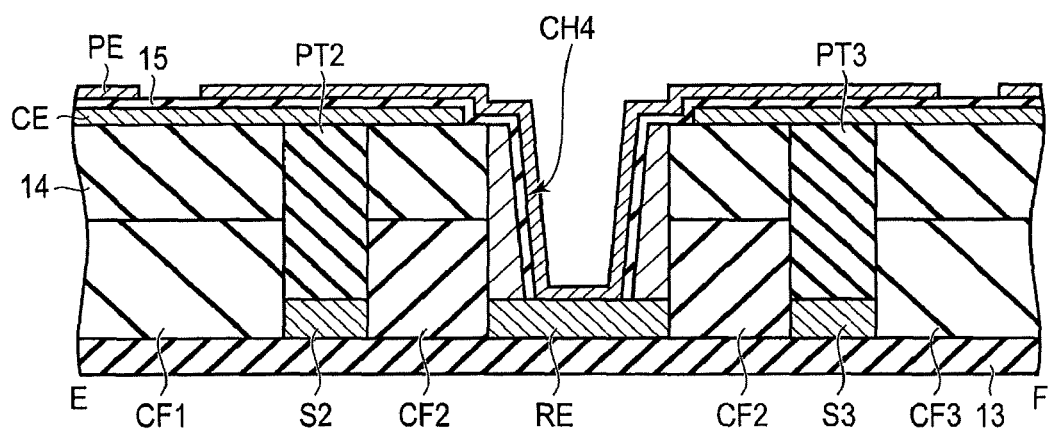
F I G. 18

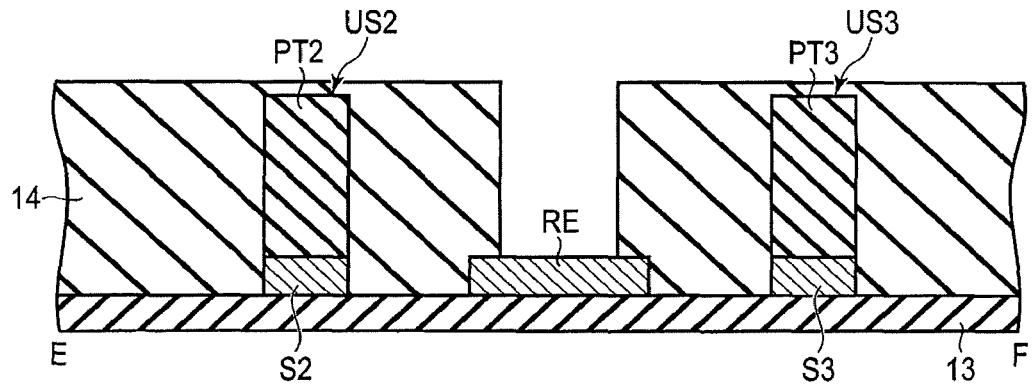
F I G. 21
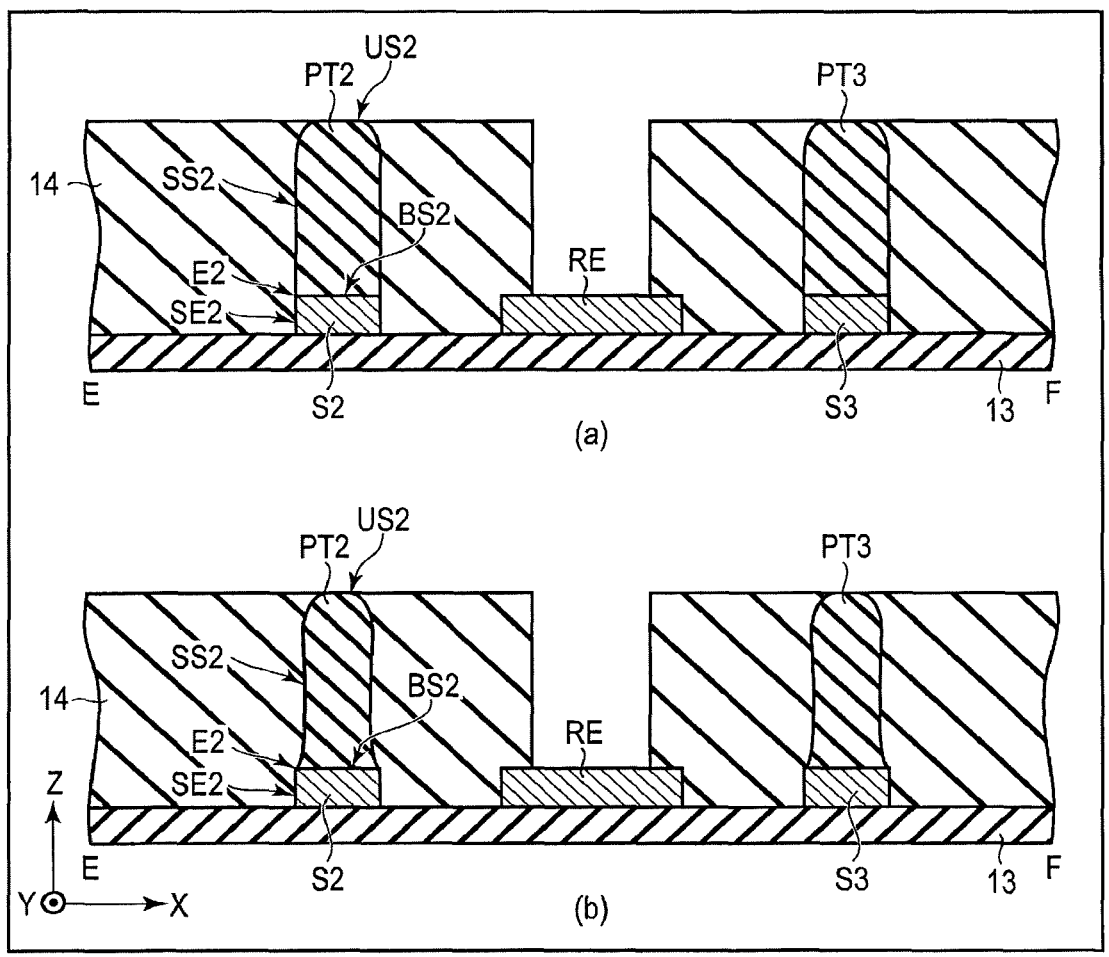
F I G. 22

DISPLAY DEVICE WITH PARTITION BETWEEN COLOR FILTERS

CROSS-REFERENCE TO RELATED APPLICATIONS

This application is based upon and claims the benefit of priority from Japanese Patent Application No. 2016-205134, filed Oct. 19, 2016, the entire contents of which are incorporated herein by reference.

FIELD

Embodiments described herein relate generally to a display device.

BACKGROUND

In recent years, display devices such as liquid crystal display devices are used in various technical fields, and there is a demand of further improving the definition in the liquid crystal display devices. As high-definition progresses, there arises the problem of mixture of colors between pixels adjacent to each other, which emit different tones of colors. In liquid crystal display devices in which color filters are formed on a counter substrate, alignment error between the counter substrate and array substrate is the most significant cause for the color mixture. Under these circumstances, the technique of forming color filters on an array substrate is known. However, for a higher definition, such a simple technique of arranging color filters on an array substrate cannot fully solve the problem of the color mixture. For fringe field switching (FFS) display devices with higher definition, a technique for suppressing color mixture is known, in which the distance from an upper portion of a signal line to a bottom portion of a liquid crystal layer is set to a predetermined value or less.

BRIEF DESCRIPTION OF THE DRAWINGS

FIG. 1 is a diagram showing an example of a display device of an embodiment.

FIG. 3 is a plan view showing a configuration example of a pixel PX when a first substrate shown in FIG. 1 is viewed from a second substrate side.

FIG. 5 is a plan view showing a configuration example of a color filter when the first substrate shown in FIG. 1 is viewed from the second substrate side.

FIG. 9 is a diagram showing the method of manufacturing the first substrate of this embodiment.

FIG. 10 is a diagram showing the method of manufacturing the first substrate of this embodiment.

FIG. 13 is a diagram showing another method of manufacturing the first substrate of this embodiment.

FIG. 14 is a diagram showing the method of manufacturing the first substrate of this embodiment.

FIG. 17 is a diagram showing the method of manufacturing the first substrate of this embodiment.

FIG. 18 is a diagram showing the method of manufacturing the first substrate of this embodiment.

FIG. 21 is a cross-sectional view showing a modified example of the first substrate of this embodiment.

FIG. 22 is a cross-sectional view showing another modified example of the first substrate of this embodiment.

DETAILED DESCRIPTION

Figure 2:
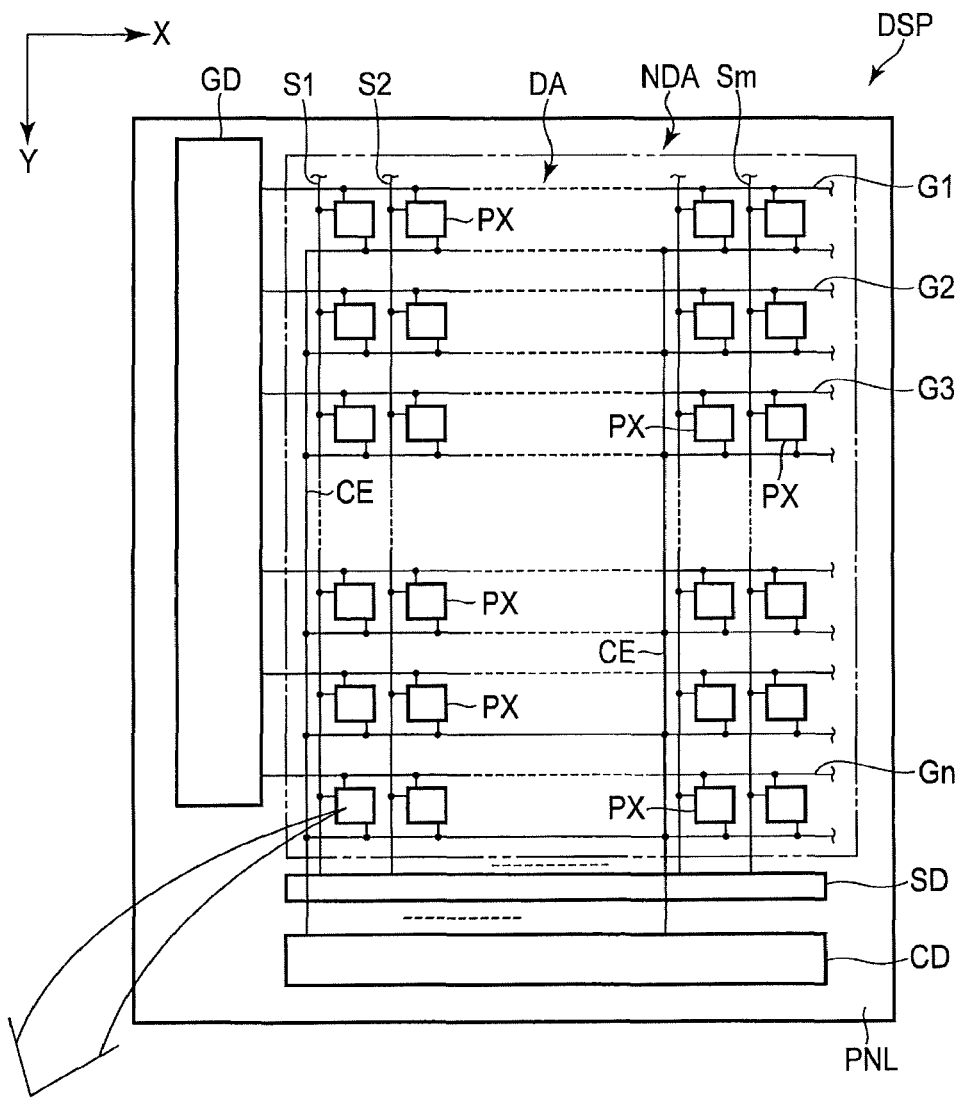
FIG. 2 is a diagram showing a basic configuration and an equivalent circuit of the display panel shown in FIG. 1.
Figure 2:
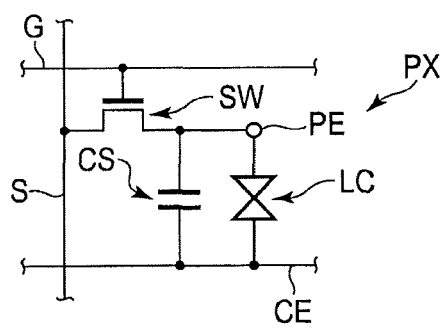

In general, according to one embodiment, a display device comprises: an insulating substrate; a light-shielding member disposed above the insulating substrate; a first color filter disposed above the insulating substrate; a second color filter disposed alongside the first color filter; a partition disposed on the light-shielding member and between the first color filter and the second color filter and an insulating film disposed on the first color filter and the second color filter, an upper surface of the partition and an upper surface of the insulating film being located on a same plane.

According to another embodiment, a display device comprises: an insulating substrate; a light-shielding member disposed above the insulating substrate; a first color filter disposed above the insulating substrate; a second color filter disposed alongside the first color filter; and a partition disposed on the light-shielding member and between the first color filter and the second color filter, an upper surface of the partition and upper surfaces of the first and second color filters being located on a same plane.

Embodiments are described with reference to accompanying drawings. Note that the disclosure is presented for the sake of exemplification, and any modification and variation conceived within the scope and spirit of the invention by a person having ordinary skill in the art are naturally encompassed in the scope of invention of the present application. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Further, in the specification and drawings, the structural elements, which have functions identical or similar to the functions described in connection with preceding drawings, are denoted by like reference numbers, and an overlapping detailed description thereof is omitted unless otherwise necessary.

FIG. 1 is a view showing the structure of a display device DSP of an embodiment. A first direction X, a second direction Y and a third direction Z illustrated in the figure are orthogonal to each other but may intersect at an angle other than 90 degrees. The first direction X and the second direction Y correspond to directions parallel to a main surface of a substrate which constitutes the display device DSP, and the third direction Z corresponds to a thickness direction of the display device DSP. The figure shows a plan view of the display device DSP in an X-Y plane defined by the first direction X and the second direction Y. In this embodiment, a liquid crystal display device is adopted as the display device DSP.

Note that the major configuration explained in the present embodiments can also be applied to a self-luminous display device comprising an organic electroluminescent (EL) element and the like, an electronic paper display device comprising an electrophoretic element and the like, a display device adopting micro-electromechanical systems (MEMS), or a display device adapting electrochromism.

The display device DSP includes a display panel PNL, a driving IC chip 1 which drives the display panel PNL, etc. The display panel PNL is a liquid crystal display panel, and includes a first substrate SUB1, a second substrate SUB2 and a liquid crystal layer (a liquid crystal layer LC which will be later). The first substrate SUB1 and the second substrate SUB2 oppose each other along the third direction Z. In the following explanation, a direction from the first substrate SUB1 toward the second substrate SUB2 is referred to as upward (or merely above), and a direction from the second substrate SUB2 toward the first substrate SUB1 is referred to as downward (or merely below). A view from the second substrate SUB2 to the first substrate SUB1 is called a plan view.

A sealing member SL adheres the first substrate SUB1 and the second substrate SUB2 together. The display panel PNL includes a display area DA for image display and a non-display area NDA surrounding the display area DA. The display area DA is located on an inner side surrounded by the sealing member SL. The sealing member SL is located in the non-display area NDA.

The driving IC chip 1 is located in the non-display area NDA. In the example illustrated, the driving IC chip 1 is mounted on a mounting portion MT of the first substrate SUB1, which extends to an outer side of the second substrate SUB2. In the driving IC chip 1, a display driver which outputs a signal necessary for displaying an image, for example, is incorporated. The display driver includes at least a part of a signal line drive circuit SD, a scanning line drive circuit GD, and a common electrode drive circuit CD, which will be described later. Note that the configuration is not limited to that of the illustrated example, but the driving IC chip 1 may be mounted on a flexible substrate connected to the display panel PNL separately. Further, the IC chip I1 may contain therein a detection circuit RC which functions as a touch panel controller or the like.

The display panel PNL of this embodiment may be, for example, a transmissive display panel which has a transmissive display function of displaying images by selectively transmitting light from behind the first substrate SUB1, a reflective display panel which has a reflective display function of displaying images by selectively reflecting light from a front side of the second substrate SUB2, or a transreflective display panel which has the transmissive display function as well as the reflective display function.

FIG. 2 is an illustration showing a basic structure and an equivalent circuit of the display panel PNL shown in FIG. 1. The display panel PNL includes a plurality of pixels PX in the display area DA. Here, a pixel PX is the minimum unit which can be controlled separately according to the video signal, and exists in a region containing a switching element disposed at a position where a scanning line and a signal line cross each other, which will be described later. A plurality of pixels PX are arrayed in a matrix along the first direction X and the second direction Y. The display panel PNL includes a plurality of scanning lines G (G1 to Gn), a plurality of signal lines S (S1 to Sm), a common electrode CE and the like, in the display area DA. The scanning lines G each extend along the first direction X and arranged along the second direction Y. The signal lines S each extend along the second direction Y and are arranged along the first direction X. The scanning lines G and the signal lines S may not extend linearly, but part of the lines may be bent. The common electrode CE is disposed over a plurality of pixels PX.

The scanning lines G, the signal lines S and the common electrode CE are drawn to the non-display area NDA. In the non-display area NDA, the scanning lines G are connected to a scanning line drive circuit GD, the signal lines S are connected to a signal line drive circuit SD, and the common electrode CE is connected to a common electrode drive circuit CD. The signal line drive circuit SD, the scanning line drive circuit GD, and the common electrode drive circuit CD may be formed on the first substrate SUB1, or these circuits may be partly or entirely built in the driving IC chip 1 shown in FIG. 1. The layout of the drive circuits is not limited to the example illustrated but, for example, scanning line drive circuits GD may be disposed on both sides of the display area DA so as to sandwich the display area DA.

Each pixel PX comprises a switching element SW, a pixel electrode PE, the common electrode CE, a liquid crystal layer LC and the like. The switching element SW is constituted by a thin-film transistor (TFT), for example, and is electrically connected to the respective scanning line G and the respective signal line S. The scanning line G is connected to the switching elements SW of the respective pixels PX arranged along the first direction X. The signal line S is connected to the switching elements SW of the respective pixels PX arranged along the second direction Y. The pixel electrodes PE are electrically connected respectively to the switching elements SW. The pixel electrodes PE each opposes the common electrode CE, and drive the liquid crystal layer LC by an electric field produced between each pixel electrodes PE and the common electrode CE. A storage capacitance CS is formed between, for example, the common electrode CE and each pixel electrode PE.

FIG. 3 is a plan view showing a configuration example of a pixel PX when the first substrate SUB1 shown in FIG. 1 is viewed from a second substrate side. The example illustrated here corresponds to a case in which a fringe field switching (FFS) mode, which is one of the display modes using the lateral electric field, is adopted.

The first substrate SUB1 includes scanning lines G1 and G2, signal lines S1 and S2, a switching element SW, a pixel electrode PE, partition walls PT1 and PT2, and the like. In one example, the first substrate SUB1 includes a common electrode, but its illustration is omitted.

Specifically, the scanning lines G1 and G2 are disposed at an interval along the second direction Y, and each of the scanning lines G1 and G2 extends along the first direction X. The signal lines S1 and S2 are disposed at an interval along the first direction X, and each of the signal lines S1 and S2 extends along the second direction Y. In the example illustrated, the pixel PX corresponds to a box-shaped area which is defined by the scanning lines G1 and G2 and the signal lines S1 and S2, and has a rectangular shape having a length along the first direction X less than that along the second direction Y. The shape of the pixel PX is not limited to rectangular, but can be changed as needed.

The switching element SW is electrically connected to the scanning line G and the signal line S. In the example illustrated, the switching element SW is formed of a thin-film transistor having a double-gate structure. The switching element SW includes a semiconductor layer SC. The semiconductor layer SC is disposed so that a part thereof overlaps the signal line S1 and the other part extends between the signal lines S1 and S2 to form substantially a U-letter. The semiconductor layer SC includes a channel region SCC1 which crosses the scanning line G2 in a region overlapping the signal line S1 and a channel region SCC2 which crosses the scanning line G2 between the signal lines S1 and S2. In the scanning line G2, the regions superimposed on the channel regions SCC1 and SCC2, respectively, function as gate electrodes GE1 and GE2. The semiconductor layer SC is electrically connected to the signal line S1 by its one end SCA and to a relay electrode RE by its other end SCB. The relay electrode RE1 is formed into an island shape and located between the scanning lines G1 and G2 and also between the signal lines S1 and S2. The switching element SW may be formed from a thin-film transistor having the double-gate structure. Moreover, in this example, the switching element SW is of the top gate structure comprising the gate electrode GE on the semiconductor layer SC, but may be of a bottom gate structure comprising the gate electrode GE under the semiconductor layer SC.

The pixel electrode PE is disposed between the scanning lines G1 and G2 and also between the signal lines S1 and S2. The pixel electrode PE comprises a main electrode portion PA and an auxiliary electrode portion PB. The main electrode portion PA and the auxiliary electrode portion PB are integrally or continuously formed and are electrically connected to each other. The pixel electrode PE illustrated comprises two main electrode portions PA extending towards the scanning line G1 from the auxiliary electrode portion PB. The main electrode portions PA each extend linearly along the second direction Y (or substantially parallel to the signal lines S1 and S2). The two main electrode portions PA are arranged along the first direction X with a gap therebetween and are formed into a belt-like shape having a constant width along the first direction X. The auxiliary electrode portion PB is arranged in a position superimposed on the relay electrode RE and is electrically connected to the relay electrode RE. Thus, the pixel electrode PE is electrically connected to the switching element SW. Note that the shape of the pixel electrode PE is not limited to that of the example illustrated, but can be changed as needed according to the shape of the pixel PX or the like.

The partitions PT1 and PT2 extend along the second direction Y to be parallel to the signal lines S1 and S2 and substantially. The partition PT1 is located on the signal line S1 and overlaps the signal line S1 in plan view. The partition PT2 is located on the signal line S2 overlaps the signal line S2 in plan view. The partitions PT1 and PT2 have substantially the width same along the first direction X, which is equal to the width of each of the signal lines S1 and S2 along the first direction X. Here, an edge PTE1 of the partition PT11 overlaps an edge SE1 of the signal line S1 in plan view, and an edge PTE2 of the partition PT2 overlaps an edge SE2 of the signal line S2 in plan view.

A light-shielding layer BM is formed to extend substantially parallel to the scanning lines G1 and G2 as indicated by an alternate long and short dash line in the figure. In the example illustrated, the light-shielding layer BM extends along the first direction X.

The light-shielding layer BM is formed in the second substrate SUB2 as will be described later. The light-shielding layer BM overlaps the scanning lines G1 and G2 in plan view. The width of the light-shielding layer BM along the second direction Y should desirably be equal to or greater than the width of each of the scanning lines G1 and G2 along the second direction Y. In the example illustrated, the light-shielding layer BM overlaps, in plan view, also a contact portion CT where the pixel electrode PE and the switching element SW are connected to each other. The light-shielding layer BM shields the light directed to the scanning lines G1 and G2 from a second substrate SUB2 side, or the light reflected by the scanning lines G1 and G2.

Figure 4:
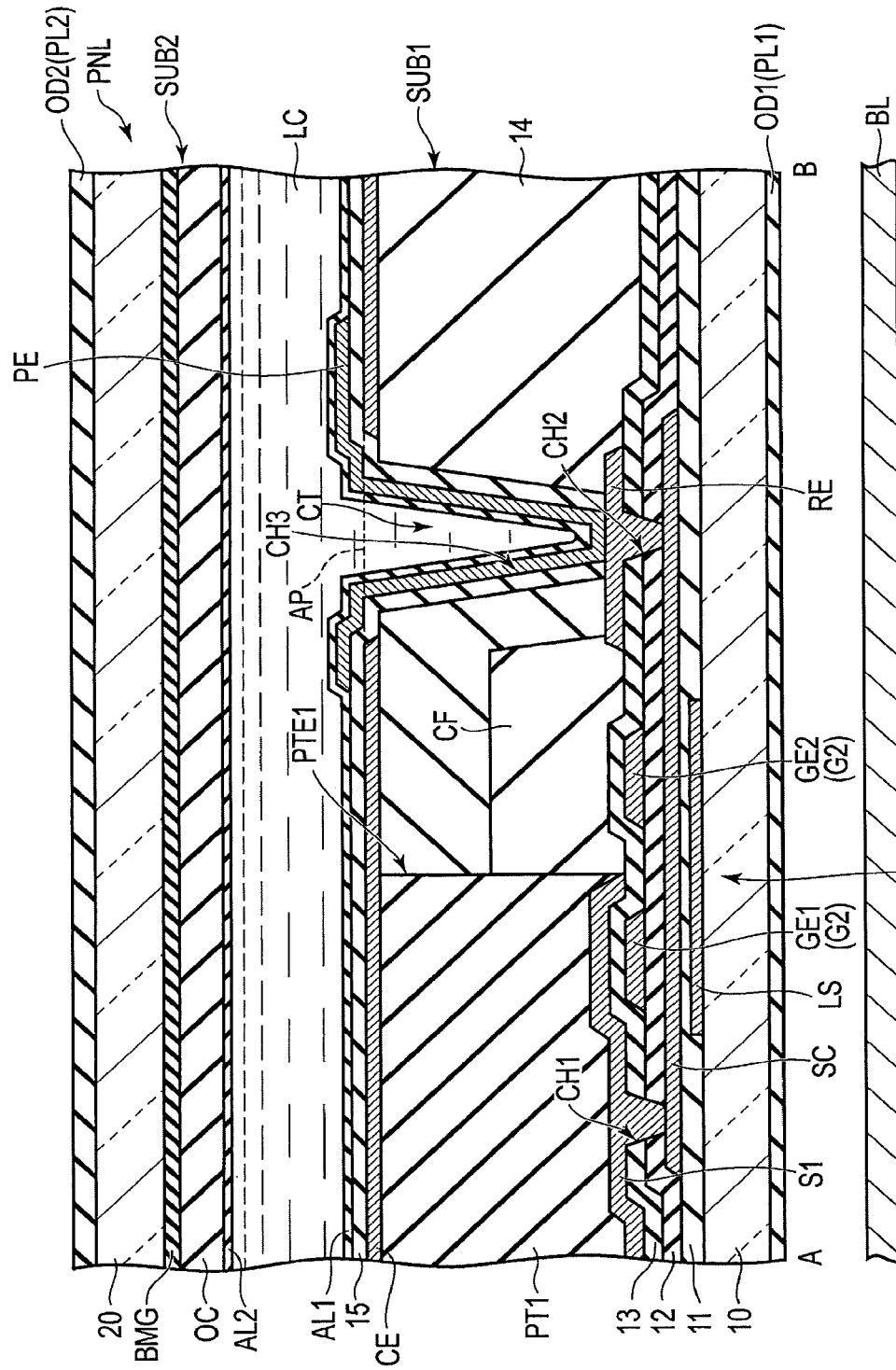
FIG. 4 is a cross-sectional view showing an example of the structure of a part of a display panel PNL taken along line A-B of FIG. 3.

FIG. 4 is a cross section showing a part of the structure of the display panel PNL taken along line A-B in FIG. 3.

The first substrate SUB1 comprises a first insulating substrate 10, a first insulating film 11, a second insulating film 12, a third insulating film 13, a fourth insulating film 14, a fifth insulating film 15, a color filter layer CF, a lower light-shielding layer LS, a switching element SW, a relay electrode RE, a common electrode CE, a pixel electrode PE, a first alignment film AL1, a partition PT1 and the like.

The first insulating substrate 10 is a transmissive substrate such as a glass or resin substrate. The lower light-shielding layer LS is located on the first insulating substrate 10, and is covered by the first insulating film 11. The lower light-shielding layer LS shields the light directed to the semiconductor layer SC from a backlight unit BL. The switching element SW is disposed on the first insulating substrate 10. The switching element SW comprises a semiconductor layer SC, gate electrodes GE1 and GE2 and the like. The semiconductor layer SC is located on the first insulating film 11, and is covered by the second insulating film 12. The semiconductor layer SC is formed of, for example, polycrystalline silicon, but may be formed of amorphous silicon or an oxide semiconductor.

The gate electrodes GE1 and GE2, which are part of the scanning line G2, are located on the second insulating film 12, and are covered by the third insulating film 13. The scanning line G1, which is not illustrated here, is also located in the same layer as that of the scanning line G2. The scanning line G2 is formed of a metal material such as aluminum (Al), titanium (Ti), silver (Ag), molybdenum (Mo), tungsten (W), copper (Cu), chromium (Cr), or an alloy of any combination of these, and may be of a single- or multi-layer structure. Note that the lower light-shielding layer LS should desirably be located directly under the semiconductor layer SC in a position opposing the gate electrodes GE1 and GE2.

The relay electrode RE and the signal line S1 are located on the third insulating film 13. The signal line S2, which is not illustrated here, is also located in the same layer as that of the signal line S1. The signal line S1 and the relay electrode RE are formed of the same material, which may be any of those metal material listed above. The signal line S1 is in contact with the semiconductor layer SC via the contact hole CH1 which penetrates the second insulating film 12 and the third insulating film 13. The relay electrode RE is in contact with the semiconductor layer SC via the contact hole CH2 which penetrates the second insulating film 12 and the third insulating film 13. That is, the relay electrode RE is electrically connected to the switching element SW.

The color filter layer CF is located on the third insulating film 13. The color filter layer CF is partially located on the relay electrode RE. The color filter layer CF is formed from a colored resin.

The fourth insulating film 14 is located on the color filter layer CF, the relay electrode RE and the third insulating film 13. The fourth insulating film 14 is an organic insulating film formed from a transparent organic insulating material such as an acrylic resin, for example, but may be an inorganic insulating film.

The partition PT1 is located on the signal line S1. The edge PTE1 of the partition PT1 is in contact with the color filter layer CF and the fourth insulating film 14.

The common electrode CE is disposed on the partition PT1 and the fourth insulating film 14. The fifth insulating film 15 is disposed on the common electrode CE and the fourth insulating film 14. Here, the fifth insulating film 15 is equivalent to an interlayer insulating film. The common electrode CE is located right above the scanning line G2, the signal line S1 and the switching element SW. The common electrode CE is located also right above the other scanning lines G1 and the other signal lines S2, which are not illustrated, and comprises an aperture AP in a position corresponding to the contact portion CT. The pixel electrode PE is disposed on the fifth insulating film 15, and is covered by the first alignment film AL1. A part of the pixel electrode PE opposes the common electrode CE via the fifth insulating film 15. The common electrode CE and pixel electrode PE are formed from a transparent oxide conductive material such as indium Tin oxide (ITO) or indium zinc oxide (IZO). The pixel electrode PE is electrically connected to the relay electrode RE via the contact hole CH3 which penetrates the fourth insulating film 14 and the fifth insulating film 15 in the contact portion CT superimposed on the aperture AP of the common electrode CE. Here, in the example shown in FIG. 4, of the common electrode CE and the pixel electrode PE, the common electrode CE placed on a lower layer side is equivalent to a first transparent electrode, and the pixel electrode PE placed on an upper layer side is equivalent to a second transparent electrode.

The first insulating film 11, the second insulating film 12, the third insulating film 13 and the fifth insulating films 15 may be inorganic insulating films such as of silicon oxide, silicon nitride and silicon oxynitride, and may be of a single- or multi-layer structure.

The second substrate SUB2 comprises a second insulating substrate 20, a light-shielding layer BM, an overcoat layer OC, a second alignment film AL2 and the like.

The second insulating substrate 20 is a light transmissive substrate such as a glass substrate or a resin substrate. The light-shielding member BM is located on the second insulating substrate 20 on a side opposing the first substrate SUB1. As shown in FIG. 3, the light-shielding layer BM is formed into a stripe shape extending along the first direction X, and is located right above the scanning line G and the switching element SW. The overcoat layer OC covers the light-shielding layer BM. The second alignment film AL2 covers the overcoat layer OC.

The first substrate SUB1 and the second substrate SUB2 described above are disposed such that the first alignment film AL1 and the second alignment film AL2 oppose each other. Although not illustrated, a spacer is formed from a resin material and disposed between the first substrate SUB1 and the second substrate SUB2. The spacer is formed in one of the first substrate SUB1 and the second substrate SUB2 to be in contact with the other substrate. Thus, a predetermined cell gap is formed between the first alignment film AL1 and the second alignment film AL2. But the spacer may contains a sub-spacer, in addition to that forms the cell gap, which is not brought into contact with the other substrate in a steady state where no external stress is applied to the display panel. The size of the cell gap is, for example, 2 to 5 μm. The first substrate SUB1 and the second substrate SUB2 are attached together with a sealing material while the predetermined cell gap is formed.

The liquid crystal layer LC is provided between the first substrate SUB1 and the second substrate SUB2 and held between the first alignment film AL1 and the second alignment film AL2. The liquid crystal layer LC contains liquid crystal molecules. The liquid crystal layer LC is formed from a positive (dielectric constant anisotropy) type liquid crystal material, or a negative (dielectric constant anisotropy) type liquid crystal material.

Further, in the display panel having the above-described structure, a first optical device OD1 including a second polarizer PL1 is disposed below the first substrate SUB1. Above the second optical device OD2, a second optical element OD2 including a second polarizer PL2 is disposed. In one example, the first polarizer PL1 and the second polarizer PL2 are arranged such that their absorption axes are orthogonal to each other. Each of the first optical element OD1 and the second optical element OD2 may further include a retardation film such as a half-wave plate or a quarter-wave plate, a scattering layer, an antireflective layer or the like as needed.

In this configuration example, during an off state where no electric field is formed between the pixel electrode PE and the common electrode CE, the liquid crystal molecules contained in the liquid crystal layer LQ are set in an initial alignment along a predetermined direction between the first alignment film AL1 and the second alignment film AL2. In such off state, the light irradiated towards the display panel PNL from the backlight unit BL is absorbed by the first optical element OD1 and the second optical element OD2, thus executing dark display. On the other hand, in the on state where an electric field is formed between the pixel electrode PE and the common electrode CE, the liquid crystal molecules are aligned along a direction different from the direction of the initial alignment by the electric field, and its aligning direction is controlled by the electric field. In such on state, part of the light irradiated from the backlight unit BL passes through the first optical element OD1 and the second optical element OD2, thus executing bright display.

FIG. 5 is a plan view showing a configuration example of color filters CF1, CF2 and CF3 when the first substrate SUB1 shown in FIG. 1 is viewed from a second substrate SUB2 side. Here, of the components which constitute the first substrate SUB1, only those required for explanation are illustrated, and the illustration of the switching elements, pixel electrodes, common electrode and the like is omitted.

The scanning lines G1 and G2 each extend along the first direction X so as to be arranged along the second direction Y. The signal lines S1 to S4 each extend along the second direction Y so as to be arranged along the first direction X. The partitions PT1 to PT4 each extend along the second direction Y so as to be arranged along the first direction X. In plan view, the signal line S1 overlaps the partition PT1, the signal line S2 overlaps the partition PT2, the signal line S3 overlaps the partition PT3 and the signal line S4 overlaps the partition PT4.

The relay electrodes RE1 to RE3 are each located between the gate lines G1 and G2. The relay electrode RE1 is located between the partitions PT1 and PT2. The relay electrode RE2 is located between the partitions PT2 and PT3. The relay electrode RE3 is located between the partitions PT3 and S4.

The color filters CF1 to CF3 each extend along the second direction Y and are arranged along the first direction X. The color filters CF1 to CF1 overlap the scanning lines G1 and G2. The color filter CF1 is located between the partitions PT1 and PT2 or between the signal lines S1 and S2. The color filter CF1 comprises an opening OP1 in a position overlapping the relay electrode RE1. The color filter CF2 is located between the partitions PT2 and PT3 or between the signal lines S2 and S3. The color filter CF2 comprises an opening OP2 in a position overlapping the relay electrode RE2. The color filter CF3 is located between the partitions PT3 and PT4 or between the signal lines S3 and S4. The color filter CF3 comprises an opening OP3 in a position overlapping the relay electrode RE3.

Figure 6:
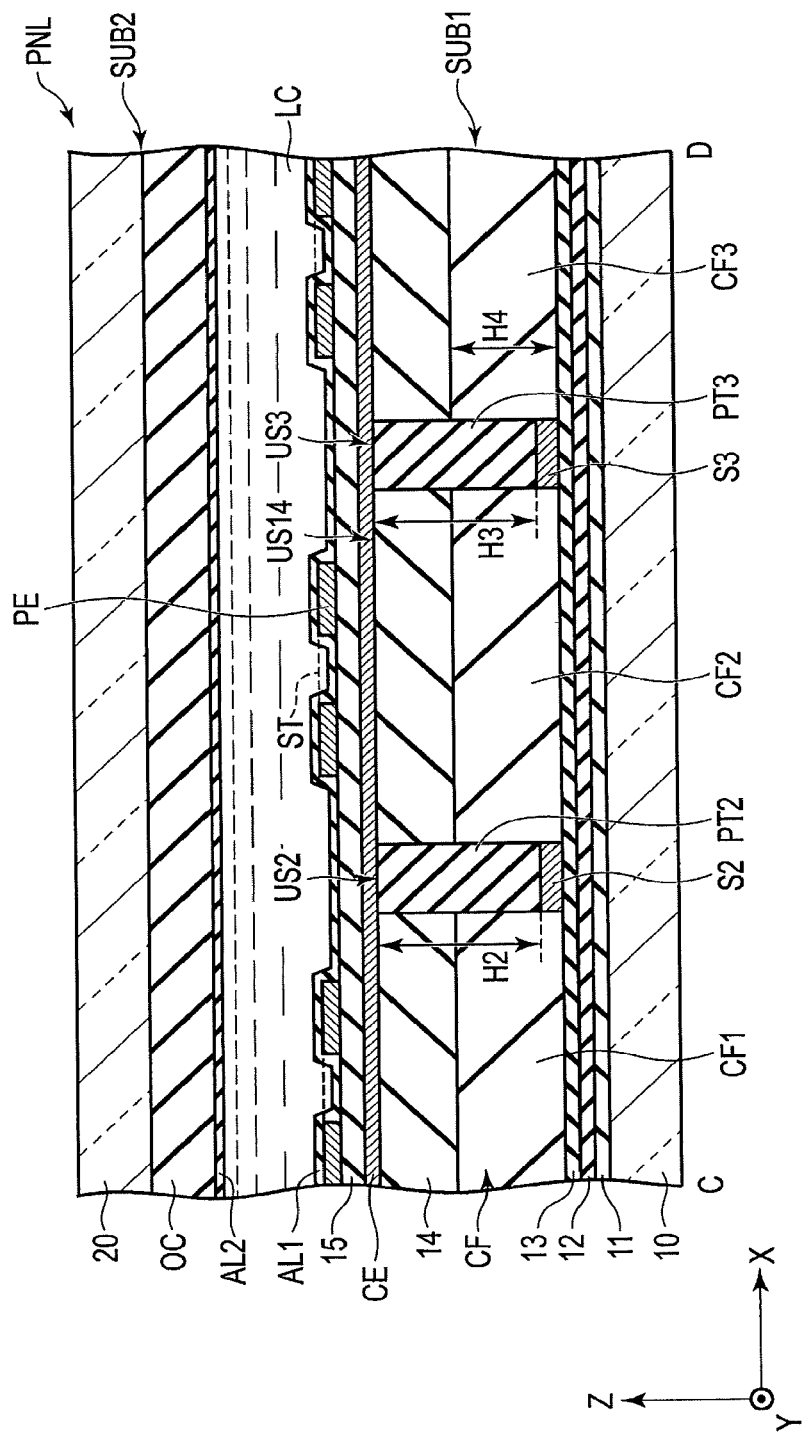
FIG. 6 is a cross-sectional view showing an example of the structure of a part of a display panel PNL taken along line C-D of FIG. 5.

FIG. 6 is a cross sectional of a part of the structure of the display panel PNL taken along line C-D in FIG. 5.

The main portion of the first substrate SUB1 will be explained. The color filters CF1 to CF3 are disposed above the first insulating substrate 10. The color filter CF2 is arranged alongside the color filter CF1 in the first direction X. The third color filter CF3 is arranged alongside the color filter CF2 in the first direction X. In one example, the color filter CF1 is a red filter, the color filter CF2 is a green filter, and the color filter CF3 is a blue filter. Note that the selection of color for the color filters CF1 to CF3 is not limited to the example provided above. For example, the color layer CF may comprise a filter of a different color from any one of the color filters CF1 to CF3. As the fourth color filter, for example, a white filter or a colorless resin material may be provided, or a transparent fourth insulating film 14 may be provided without providing a color filter.

The signal lines S2 and S3 are disposed above the first insulating substrate 10. Here, in this embodiment, the signal lines S2 and S3 are each equivalent to a light-shielding member. The partition PT2 is disposed on the signal line S2. The signal line S2 and the partition PT2 are located between the color filters CF1 and CF2. Here, for example, the color filter CF1 is equivalent to a first color filter and the color filter CF2 is equivalent to a second color filter. The partition PT3 is disposed on the signal line S3. The signal line S3 and the partition PT3 are located between the color filters CF2 and CF3. The partitions PT2 and PT3 are each formed from a transparent organic material, for example. In this case, light reaches the depths of the partitions PT2 and PT3 in an exposure process during the formation of the partitions PT2 and PT3, and therefore they can be formed into a desired shape easily.

Note that the partitions PT2 and PT3 may be formed from an organic material containing black pigment. In this case, even when observing the display device not only from, for example, a front direction (the third direction Z in the figure) but also from an oblique direction inclined from the front direction, transmitting light of an adjacent color filter of some other color can be shielded, thereby suppressing degradation of the display quality, which may be caused by color mixture.

In this embodiment, a height H2 of the partition PT2 along the third direction Z is equal to a height H3 of the partition PT3 along the third direction Z and is, for example, about 4 μm. A height H4 of the color filter layer CF along the third direction Z is equal to or less than the height H3 of the partition PT and is, for example, about 2 to 4 μm. As will be described later, the fourth insulating film 14 may be omitted, in which case, the heights H2, H3 and H4 are set to be substantially equal to each other. More specifically, a total of the height H2 and the height of the signal line S2 along the third direction Z, a total of the height H3 and the height of the signal line S3 along the third direction Z and the height H4 are set to be equal to each other as will be described later.

The fourth insulating film 14 is disposed on the color filters CF1 to CF3. An upper surface US14 of the fourth insulating film 14, an upper surface US2 of the partition PT2 and an upper surface US3 of the partition PT3 are located on the same plane defined by the first direction X and the second direction Y. That is, the total of the height of the signal line and the height of the partition is substantially equal to the total of the height of the color filter and the height of the fourth insulating film 14. In another point of view, the distance from the third insulating film 13 to the common electrode CE along the third direction Z at the position where the signal line and the partition are located is substantially equal to that at the position where the color filter and the fourth insulating film are located. With the above-described arrangement of the fourth insulating film 14, the level difference between the partitions PT2 and PT3 and the color filter CF can be lessened. Note that the fourth insulating film 14 may be formed from the same material as that of the partitions PT2 and PT3.

In the example illustrated, the common electrode CE is in contact with the upper surfaces US2, US3 and US14. The pixel electrodes PE opposes the common electrode CE via the fifth insulating film 15. The pixel electrodes PE each comprise a slit ST opposing the common electrode CE.

In the second substrate SUB2, the light-shielding layer is not located directly above the signal lines S2 and S3, and the second insulating substrate 20 and the overcoat layer OC are in contact with each other.

Figure 11:
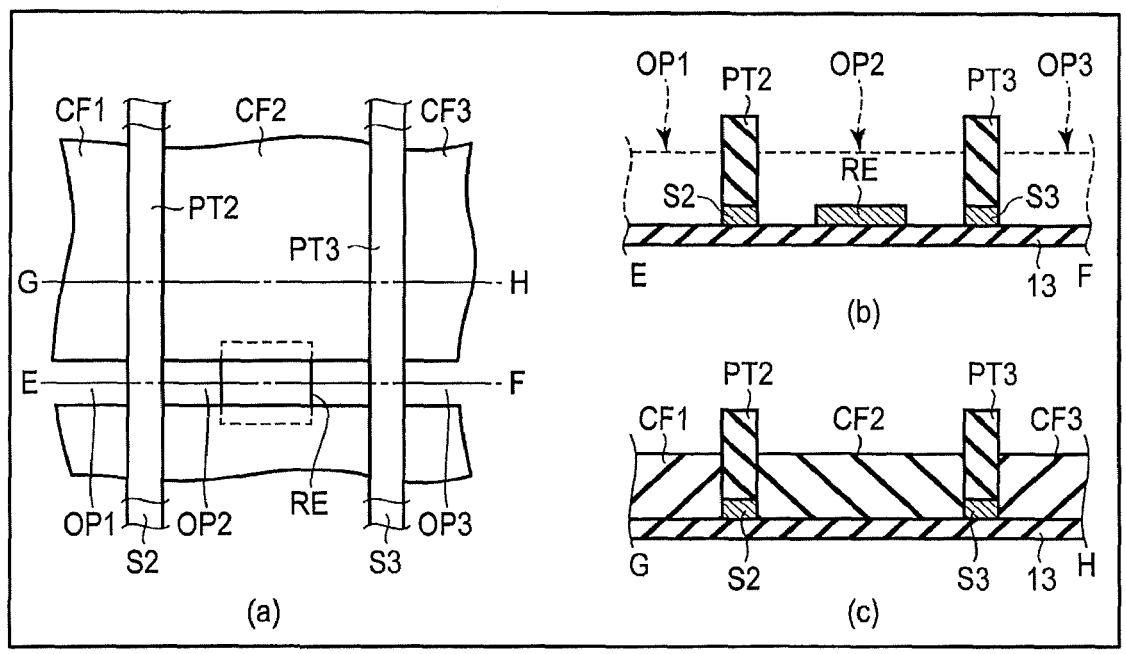
FIG. 11 is a diagram showing the method of manufacturing the first substrate of this embodiment.
Figure 12:
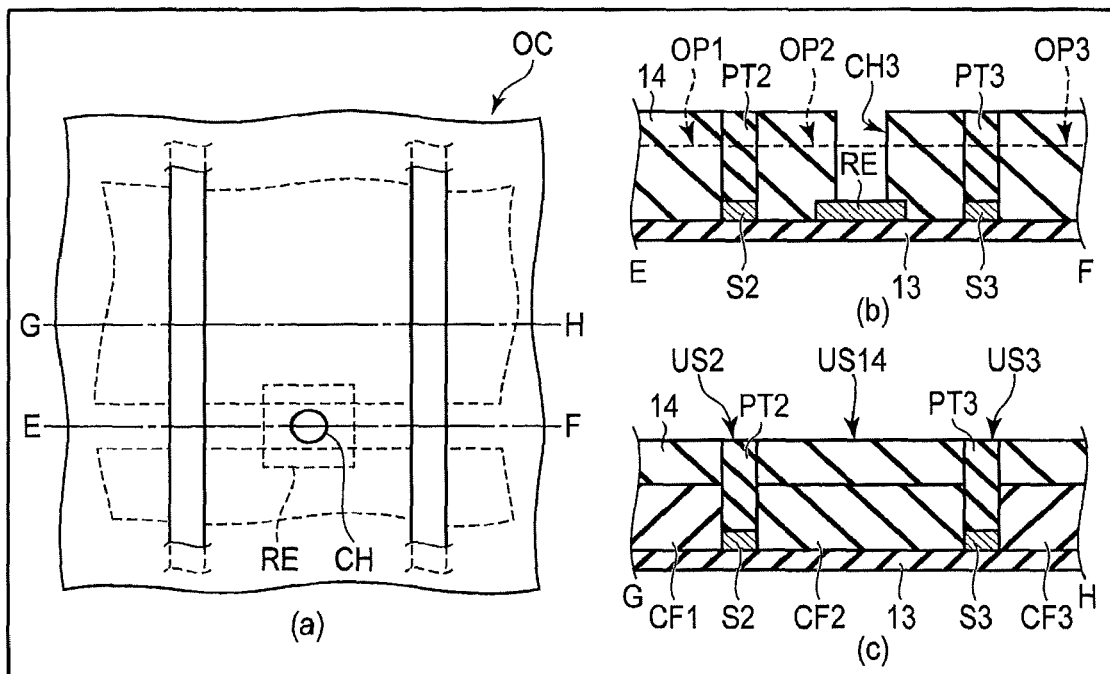
FIG. 12 is a diagram showing the method of manufacturing the first substrate of this embodiment.

Next, a method of manufacturing the display device of this embodiment will be described with reference to FIGS. 7 to 12. FIGS. 7 to 12 show the method of preparing the first substrate SUB1 according to this embodiment. Part (a) of each of FIGS. 7 to 12 is a plan view of the first substrate shown in FIG. 1 taken from the second substrate side. Part (b) of each of FIGS. 7 to 12 is a cross section of a part of the structure of the display panel PNL taken along line E-F in part (a) of each respective one of FIGS. 7 to 12. Part (c) of each of FIGS. 11 and 12 is a cross section of a part of the structure of the display panel PNL taken along line G-H in part (a) of each respective one of FIGS. 11 and 12. Note that in parts (b) of each of FIGS. 7 to 12 and part (c) of each of FIGS. 11 and 12, the illustration of the structure below the third insulating film 13 is omitted.

Figure 7:
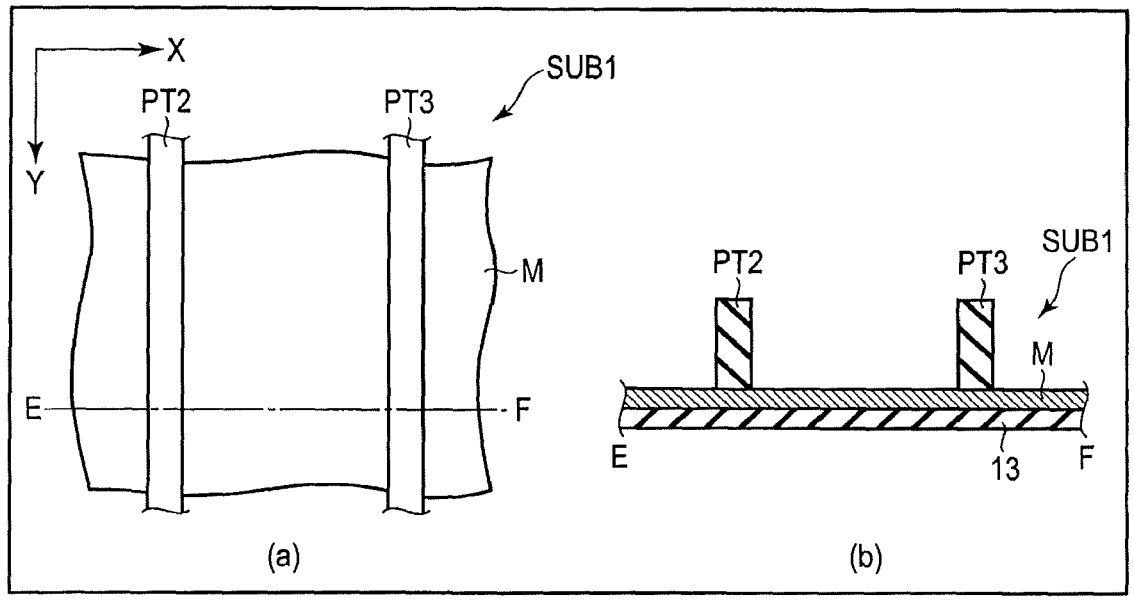
FIG. 7 is a diagram showing a method of manufacturing the first substrate of this embodiment.

As shown in FIG. 7, part (b), a metal layer M is formed on the third insulating film 13 with a technique such as sputtering. That is, the metal layer M is formed above the first insulating substrate. Next, the partitions PT2 and PT3 are formed on the metal layer M. More specifically, an organic material is applied on the metal layer M, and a mask of a desired shape is provided thereon. Then, light is irradiated thereon, followed by a developing process, to remove the organic material from the portions other than those giving rise to the partitions PT2 and PT3. After that, calcination is carried out at, for example, about 230 degrees and thus the partitions PT2 and PT3 are formed. Here, as shown in FIG. 7, part (a), the partitions PT2 and PT3 each extend along the second direction Y, and are arranged along the first direction X. As will be described later, a positive- or negative-type organic material is used for the partitions PT2 and PT3, and in the case of the positive type, the region irradiated with light dissolves into the developing solution, whereas in the case of the negative type, the region irradiated with light hardens.

Figure 8:
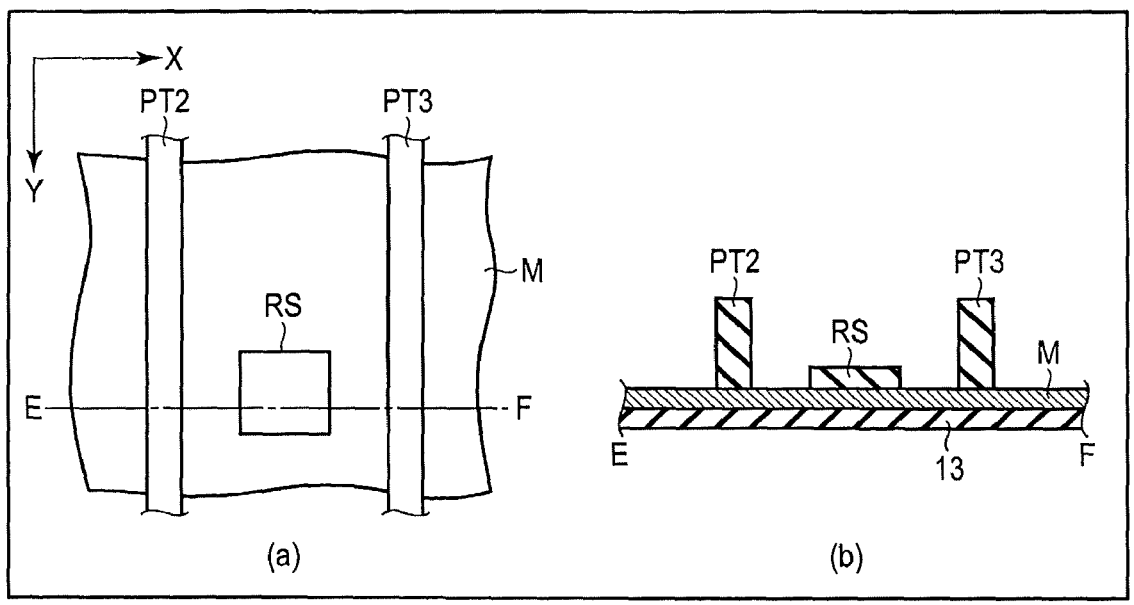
FIG. 8 is a diagram showing the method of manufacturing the first substrate of this embodiment.

Then, as shown in FIG. 8, parts (a) and (b), an island-like resist RS is formed between the partition PT1 and the partition PT2 so as to be separated from the partition PT1 and the partition PT2. As shown in FIG. 8, part (b), the resist RS is formed on the metal layer M. For example, the thickness of the resist RS is less than that of the partition PT2 or the like, as shown.

Subsequently, as shown in FIG. 9, parts (a) and (b), the metal layer M is etched using the partition PT2, partition PT3 and resist RS as a mask, to from the signal line S2 under the partition PT2, the source line S3 under the partition PT3 and the relay electrode RE under the resist RS. Since the source line S2 is formed by using the partition PT2 as a mask, the edge PTE2 of the partition PT2 and the edge SE2 of the source line S2 overlap each other. Similarly, the edge PTE3 of the partition PT3 and the edge SE3 of the source line S3 overlap, and an edge of the resist RS and an edge of the relay electrode RE overlap. Here, for example, the source line S2 is equivalent to the first signal line and the source line S3 is equivalent to the second signal line.

Next, as shown in FIG. 10, parts (a) and (b), the resist RS is removed. On the other hand, the partitions PT2 and PT3 are not removed. If the surface of the relay electrode RE is removed while removing the resist RS, the thickness of the relay electrode RE may be less than that of the signal lines S2 and S3, although it depends on the conditions for removing the resist RS.

Next, as shown in FIG. 11, parts (a) to (c), the color filter CF1 is formed to be adjacent to the partition PT2, the color filter CF2 is formed between the partition PT2 and the partition PT3, and the color filter CF3 is formed to be adjacent to the partition PT3. As shown in FIG. 11, part (c), the color filters CF1 to CF3 are formed on the third insulating film 13. The level of the upper surfaces of the color filters CF1 to CF3 is lower than that of the upper surfaces of the partitions PT2 and PT3. The color filter CF2 is in contact with side surfaces of each of the signal lines S2 and S3, and with side surfaces of each of the partitions PT2 and PT3. At this time, as shown in FIG. 11, part (a), the opening OP1 is formed in the color filter CF1, the opening OP2 is formed in the color filter CF2, and the opening OP3 is formed in the color filter CF3. That is, as shown in FIG. 11, part (b), in the section which passes along the openings OP1 to OP3, the color filters CF1 to CF3 are not formed. In the example illustrated, the color filter CF2 is not disposed on the relay electrode RE.

Subsequently, as shown in FIG. 12, parts (a) to (c), the fourth insulating film 14 is formed on the color filters CF1 to CF3. As shown in FIG. 12 (b), in the openings OP1 to OP3, the fourth insulating film 14 is in contact with the third insulating film 13 and the relay electrode RE. Further, in the opening OP2, the fourth insulating film 14 is in contact with the side surfaces of each of the signal lines S2 and S3 and the side surfaces of each of the partitions PT2 and PT3. Further, the contact hole CH3 is formed in the fourth insulating film 14 so as to penetrate even the relay electrode RE. As shown in FIG. 12, part (c), the fourth insulating film 14 is in contact with the side surface of each of the partitions PT2 and PT3, but not with the side surfaces of each of the signal lines S2 and S3. The fourth insulating film 14 is formed so that so that the upper surface US14 thereof are located on the same plane as that of the upper surfaces US2 and US3. In other words, the upper surface US2 and the upper surface US3 are exposed from the fourth insulating film 14.

According to this embodiment, in the configuration in which the color filter layer CF includes the color filters CF1 and CF2 of different colors, the partition PT2 disposed on the signal line S2 is arranged between the color filters CF1 and CF2. Further, the color filter CF2 is arranged between the two adjacent partitions PT2 and PT3. With this configuration, highly precise alignment is no longer necessary for forming the color filters in contrast to the comparative example in which the two adjacent color filters CF1 and CF2 are stacked on one another on the signal line S2.

Moreover, the partition PT2 functions as the mask for patterning the signal line S2, the increase in the number of steps in the manufacturing process can be suppressed as compared to the case where the partition is formed in a separate step from the patterning of the signal line S2.

In the comparative example, due to the variation in the formation of the color filters CF1 and CF2, the two color filters CF1 and CF2 are stacked on the signal line S2 occasionally, thereby possibly forming a projecting step portion, or the color filters CF1 and CF2 are separated from each other on the signal line S2 or dropped off from the signal line S2 occasionally, thereby possibly forming a recessing step portion. By contrast, according to this embodiment, the formation of such projection or recess caused by the variation in the formation of the color filters CF1 and CF2 can be suppressed. Moreover, the degradation of the color purity caused by the displacement of the color filters CF1 and CF2 from the predetermined region (the opening between signal lines) can be suppressed. Furthermore, the upper surface US14 of the fourth insulating film 14 disposed on the color filters CF1 and CF2 is located on the same plane as that of the upper surface US2 of the partition PT2. With this configuration, the flatness of the interface between itself and the liquid crystal layer LC of first substrate SUB1 can be improved. Therefore, the disorder in alignment of the liquid crystal molecules, caused by the unevenness of the first substrate SUB1 can be suppressed.

As described above, according to this embodiment, a display device which can suppress the deterioration of display quality and a method of manufacturing such a display device can be acquired.

Next, another method of manufacturing the display device of this embodiment will be described with reference to FIGS. 13 to 18. FIGS. 13 to 18 show another method of preparing the first substrate SUB1 according to this embodiment. Part (a) of each of FIGS. 13 to 16 is a plan view of the first substrate shown in FIG. 1 when viewed from the second substrate side. Part (b) of each of FIGS. 13 to 16 is a cross section showing a part of the structure of the display panel PNL taken along line E-F in (a) of each respective one of FIGS. 13 to 16. FIGS. 17 and 18 show the processing step following FIG. 16, part (b).

The steps shown in FIG. 13, parts (a) and (b) differ from those of FIG. 7 in that an island portion IS is formed. As shown in FIG. 13, part (a), the island portion IS is formed between the partition PT2 and the partition PT3. Further, as shown in FIG. 13, part (b), the island portion IS is formed on the metal layer M as so are the partitions PT2 and PT3. The island portion IS is formed in the same process and from the same material as those of the partitions PT2 and PT3. Here, a height H1 of the island portion IS, the height H2 of the partition PT2 and the height H3 of partition PT3 are equal to each other. Furthermore, while forming the island portion IS, a hole portion HL is formed therein by half-tone exposure or under-exposure. That is, the hole portion HL does not penetrate the island portion IS to the metal layer M and therefore a bottom portion BT is created at a level lower than the height H1.

Subsequently, as shown in FIG. 14, parts (a) and (b), the metal layer M is etched using the partition PT2, the partition PT3 and the island portion IS as a mask, thereby forming the source line S2 under the partition PT2, the source line S3 under the partition PT3 and the relay electrode RE under the island portion IS. Since the relay electrode RE is formed by using the island portion IS as the mask, an edge ISE of the island portion IS and an edge REE of the relay electrode RE overlap each other.

Figure 15:
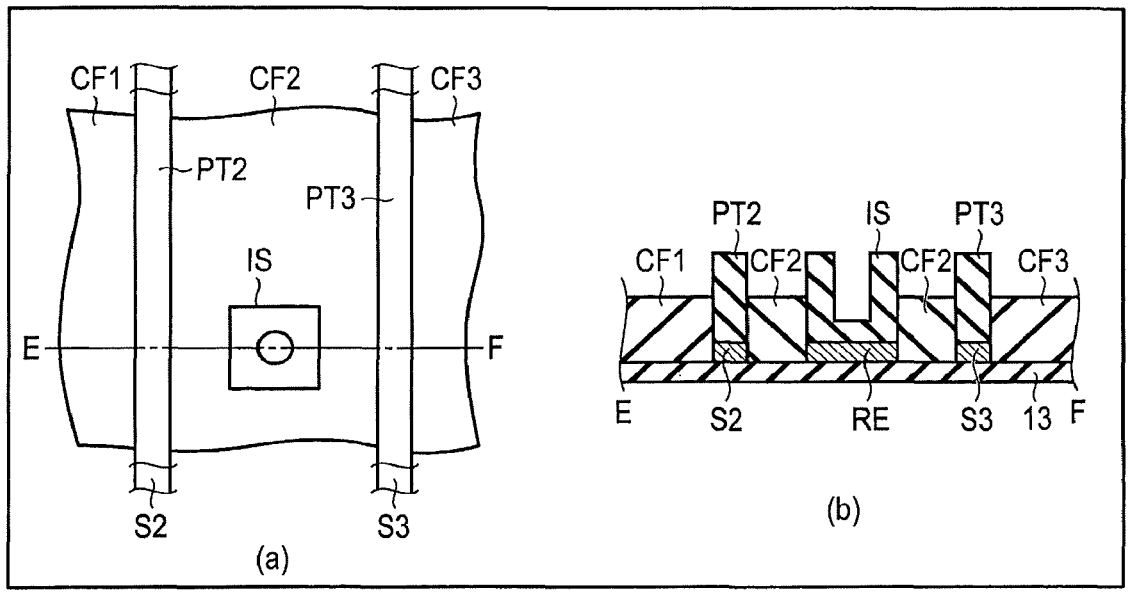
FIG. 15 is a diagram showing the method of manufacturing the first substrate of this embodiment.

Then, as shown in FIG. 15, parts (a) and (b), the color filter CF1 is formed to be adjacent to the partition PT2, the color filter CF2 is formed between the partitions PT2 and PT3, and the color filter CF3 is formed to be adjacent to the partition PT3. As shown in FIG. 15, part (b), the color filter CF2 is located also between the island portion IS and the partition PT3 and between the island portion IS and the partition PT2.

Figure 16:
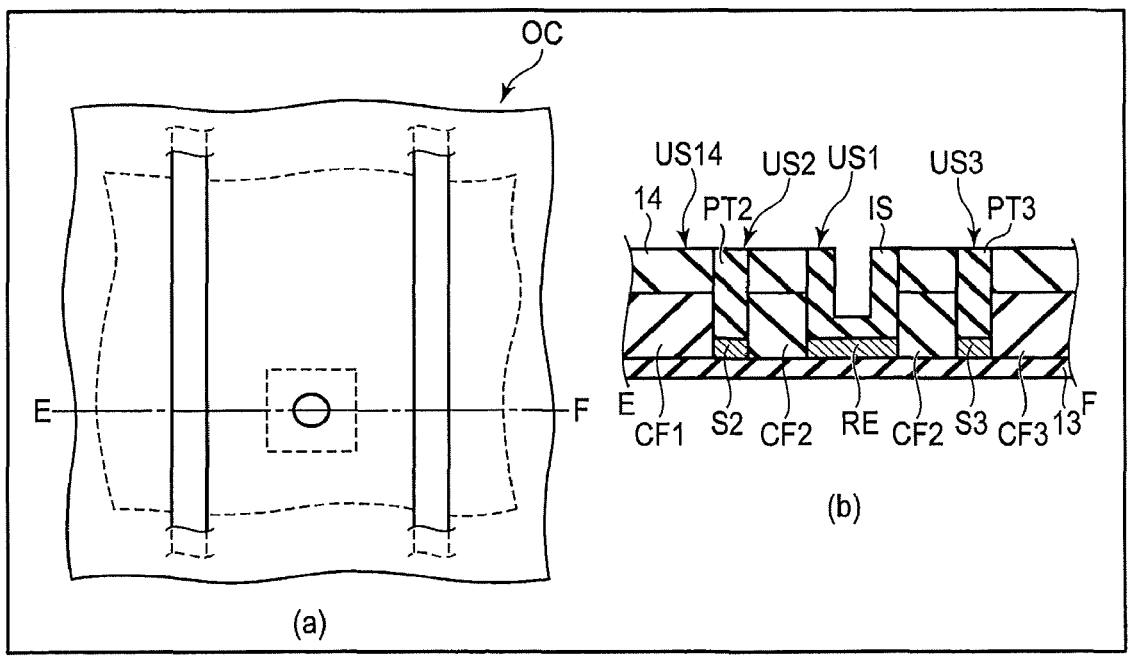
FIG. 16 is a diagram showing the method of manufacturing the first substrate of this embodiment.

Next, as shown in FIG. 16, parts (a) and (b), the fourth insulating film 14 is formed to cover the color filters CF1 to CF3. The fourth insulating film 14 covers the color filter CF2 even between the island portion IS and the partition PT2. Further, the fourth insulating film 14 covers the color filter CF2 also between the island portion IS and the partition PT3. At this time, the upper surface US14, upper surface US2, upper surface US3 and the upper surface US1 of the island portion IS are located on the same plane.

Then, as shown in FIG. 17, the common electrode CE is formed on the fourth insulating film 14 and the partitions PT2 and PT3. Next, the fifth insulating film 15 is formed on the common electrode CE. At this time, the fifth insulating film 15 is formed also inside the hole portion HL of the island portion IS. The fifth insulating film 15 disposed on the bottom portion BT in the hole portion HL is removed by dry etching, together with the bottom portion BT at the same time.

As shown in FIG. 18, with the above-described process, the contact hole CH4 now penetrating even to the relay electrode RE is formed in the island portion IS. Then, the pixel electrode PE is formed on the fifth insulating film 15. The pixel electrode PE is electrically connected to the relay electrode RE via the contact hole CH4.

In the process steps shown in FIGS. 13 to 18, the island portion IS is formed in the same processing as that of the partitions PT2 and PT3, which can be utilized as an etching mask for forming the relay electrode RE. Therefore, the step of forming a resist can be omitted as compared to the manufacturing method described with reference to FIGS. 7 to 12, making it possible to reduce the manufacturing cost.

Figure 19:
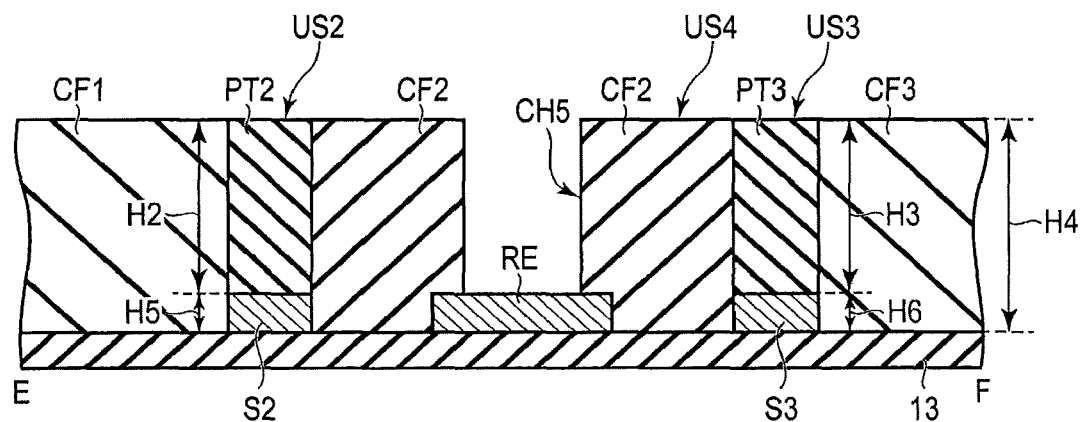
FIG. 19 is a diagram showing the method of manufacturing the first substrate of this embodiment.
Figure 20:
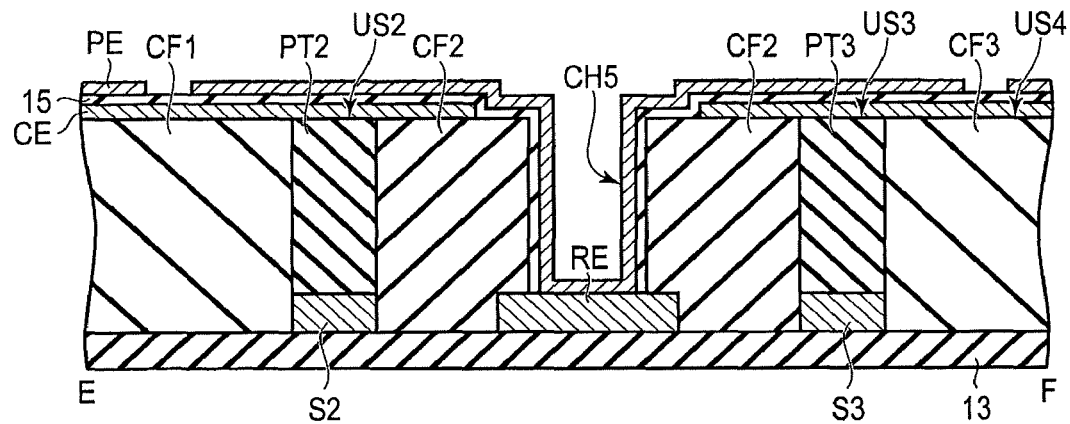
FIG. 20 is a diagram showing the method of manufacturing the first substrate of this embodiment.

Next, still another method of manufacturing the display device of this embodiment will be described with reference to FIGS. 19 and 20. FIGS. 19 and 20 showing another method of preparing the first substrate SUB1 according to this embodiment.

FIG. 19 shows the process step following those shown in FIG. 10, parts (a) and (b). More specifically, as shown in FIG. 19, the color filter CF1 is formed to be adjacent to the partition PT2, the color filter CF2 is formed between the partitions PT2 and PT3, and the color filter CF3 is formed to be adjacent to the partition PT3. At this time, a contact hole CH5 is formed in the color filter CF2 so as to penetrate even to the relay electrode RE.

Here, the color filters CF1 to CF3 have the same height H4 along the third direction Z. Further, the source line S2 has a height H5 along the third direction Z, and the source line S3 has a height H6 along the third direction Z. At this time, H4, a total of the heights of the partition PT2 and the source line S2 (H2+H5), and a total of the heights of the partition PT3 and the source line S3 (H3+H6) are equal to each other. In other words, the upper surface US2, the upper surface US3 and the upper surface US4 of the color filters CF1 to CF3 are located on the same plane. Note that the upper surfaces US2 and US3 may be higher in level than the upper surface US4.

Subsequently, as shown in FIG. 20, the common electrode CE is formed on the color filters CF1 to CF3 and the partitions PT2 and PT3. The common electrode CE is in contact with the upper surface US2, the upper surface US3 and the upper surface US4. Then, the fifth insulating film 15 is formed to cover the common electrode CE. The pixel electrode PE is formed on the fifth insulating film 15. The pixel electrode PE is electrically connected to the relay electrode RE via the contact hole CH5.

In the processing step shown in FIGS. 19 and 20, the step of forming the fourth insulating film 14 can be omitted as compared to the manufacturing method described with reference to FIGS. 7 to 12, thereby further reducing the manufacturing cost.

FIG. 21 is a cross section showing a modified example of the first substrate SUB1 of this embodiment. FIG. 21 differs from FIG. 12, part (b) in that the fourth insulating film 14 covers the partitions PT2 and PT3. Here, for example, the thickness of the portion of the fourth insulating film 14, which covers the upper surface US2 of the partition PT2 and the upper surface US3 of the partition PT3, is 0.2 to 0.3 μm.

In such a modified example as well, an advantageous effect similar to that described can be acquired.

FIG. 22 is a cross section showing another modified example of the first substrate SUB1 of this embodiment.

FIG. 22, part (a) shows the case where the partitions PT2 and PT3 are formed from a positive type material. Here, the partition PT2 will be focused to describe the shape of the partitions. The upper surface US2 is substantially a plane parallel to the X-Y plane. Side surfaces SS2 are each substantially a plane parallel to the Y-Z plane.

FIG. 22, part (b) shows the case where the partitions PT2 and PT3 are formed from a negative type material. Here, the partition PT2 will be focused to describe the shape of the partitions. The upper surface US2 is substantially a curved surface. Further, the side surface SS2 is each formed to comprise curved surfaces respectively on a side close to the upper surface US2 and a side close to the bottom surface BS2 and also a plane parallel to the Y-Z plane in a middle part.

In FIG. 22, parts (a) and (b), the width of the bottom surface BS2 of the partition PT2 along the first direction X is equal to the width of the source line S2 along the first direction X. That is, the edge E2 of the bottom surface BS2 overlaps the edge SE2 of the source line S2.

In such a modified example as well, an advantageous effect similar to that described can be acquired.

Note that in both cases of the material of the partitions PT2 and PT3 is the positive type and negative type, it is possible to form the partitions PT2 and PT3 by, for example, mixing a black color material such as graphite therein.

Figure 23:
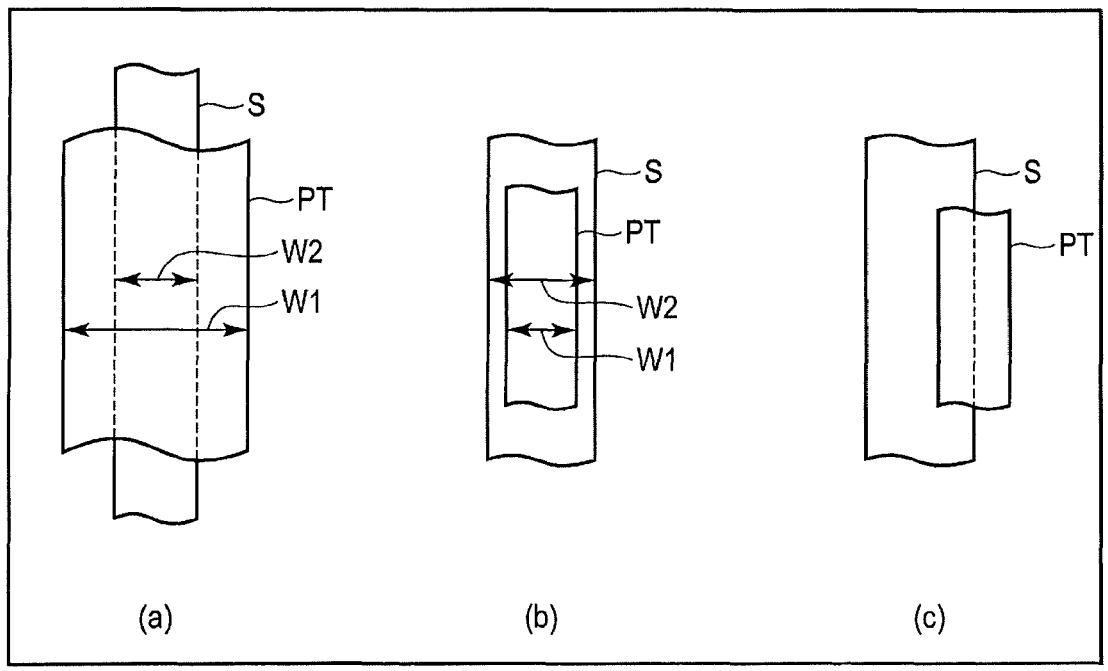
FIG. 23 is a plan view showing a partition wall and a signal line with relative to each other in position.

FIG. 23 shows plan views each showing the partition PT and the signal line S with relative to each other in position. The above-described examples are described in connection with the case where the width of the partitions is equal to the width of the signal lines and the edges thereof overlap each other in plan view, but the embodiment is not limited to this. In the above-described examples the signal lines are formed by etching a metal layer using partitions as a mask; however, depending on the etching conditions, the width W2 of the signal line S can become less than the width W1 of the partition PT as shown in FIG. 23, part (a).

Further, if other manufacturing methods are applied, the edge of the partition PT may not be equal to the edge of the signal line S. For example, as shown in FIG. 23, part (b), the width W2 of the signal line S can become greater than the width W1 of the partition PT. In this case, the edge of the partition PT does not overlap the edge of the signal line S, but is located directly above the signal line S. At this time, the color filters located on both sides of the partition PT each overlap the edge of the signal line. Furthermore, as shown in FIG. 23, part (c), the partition PT may be displaced to overlap the signal line S. In this case, one edge of the partition PT is located directly above the signal line S, and the other edge of the partition PT does not overlap the signal line S. At this time, the color filter adjacent to the one edge of the partition PT overlaps the edge of the signal line S.

Figure 24:
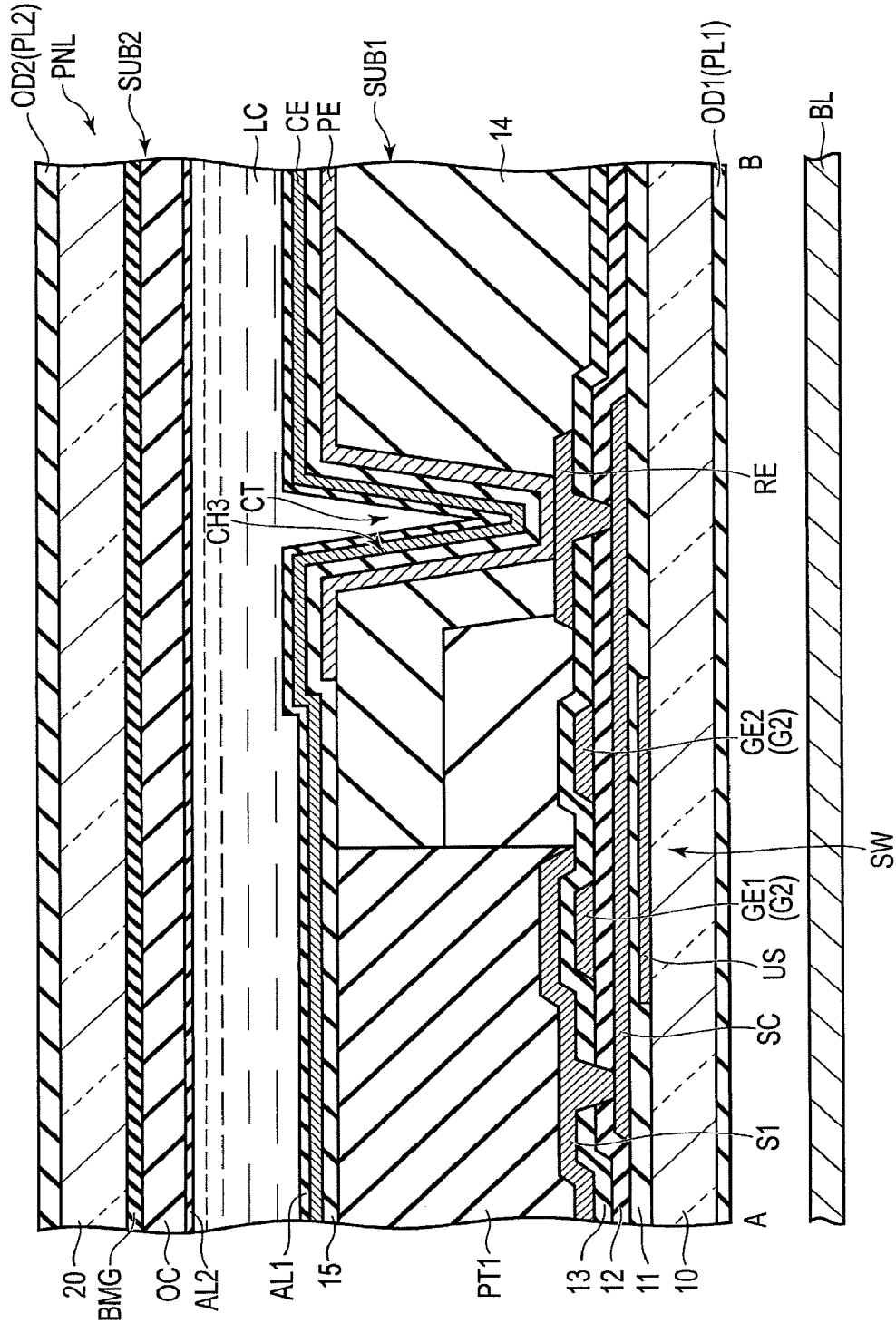
FIG. 24 is a cross-sectional view showing a modified example of the display panel according to the embodiment.

FIG. 24 is a cross section showing a modified example of the display panel PNL of this embodiment. The example of FIG. 24 differs from that of FIG. 4 in that the common electrode CE is located on a liquid crystal layer LC side with respect to the pixel electrode PE.

The pixel electrode PE is disposed on the fourth insulating film 14. The pixel electrode PE is electrically connected to the relay electrode RE via the contact hole CH3. The fifth insulating film 15 covers the pixel electrode PE. The fifth insulating film 15 is located also on the fourth insulating film 14 and the partition PT1. The common electrode CE is disposed on the fifth insulating film 15. The first alignment film AL1 covers the common electrode CE. Here, in the example shown in FIG. 24, the pixel electrode PE located on the lower side is equivalent to the first transparent electrode, and the common electrode CE located on the upper side is equivalent to the second transparent electrode.

As described above, according to this embodiment, a display device which can suppress the deterioration of display quality and a method of manufacturing such a display device can be acquired.

This embodiment is described in connection with the example where the color filter is provided on the first substrate SUB1 and the signal line S is equivalent to a light-shielding member, but it is not limited to this example. For example, in the structure in which the color filter is provided in the first substrate SUB1, the scanning lines may be equivalent to the light-shielding member. Moreover, in the structure in which the color filter is provided in the second substrate SUB2, the light-shielding layer disposed on second substrate SUB2 may be equivalent to the light-shielding member.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
an insulating substrate;
a switching element disposed on the insulating substrate and connected to a signal line;
a relay electrode connected to the switching element;
a first color filter disposed above the insulating substrate;
a second color filter disposed alongside the first color filter;
a partition disposed on the signal line and between the first color filter and the second color filter;
an insulating film disposed on the first color filter and the second color filter;
a first transparent electrode disposed on the insulating film;
an interlayer insulating film disposed on the first transparent electrode; and
a second transparent electrode disposed on the interlayer insulating film, wherein
an upper surface of the partition and an upper surface of the insulating film are located on a same plane, and
the insulating film is in contact with the relay electrode and comprises a contact hole penetrating to the relay electrode.

2. The display device of claim 1, wherein
an edge of the partition overlaps an edge of the signal line in plan view.

3. The display device of claim 1, wherein
the partition is formed from a transparent organic material.

4. The display device of claim 1, wherein
the partition is formed from an organic material containing a black pigment.

5. The display device of claim 1, wherein
the first transparent electrode is electrically connected to the relay electrode via the contact hole.

6. The display device of claim 1, wherein
the second transparent electrode is electrically connected to the relay electrode via the contact hole.

7. A display device comprising:
an insulating substrate;
a switching element disposed on the insulating substrate and connected to a signal line;
a relay electrode connected to the switching element;
an island portion disposed on the relay electrode;
a first color filter disposed above the insulating substrate;
a second color filter disposed alongside the first color filter;
a partition disposed on the signal line and between the first color filter and the second color filter;
an insulating film disposed on the first color filter and the second color filter;
a first transparent electrode disposed on the insulating film;
an interlayer insulating film disposed on the first transparent electrode; and
a second transparent electrode disposed on the interlayer insulating film,
wherein
the island portion comprises a contact hole penetrating to the relay electrode.

8. The display device of claim 7, wherein
the island portion and the partition have a same height.

9. The display device of claim 7, wherein
the partition and the island portion are formed from a same material.

10. A display device comprising:
an insulating substrate;
a switching element disposed on the insulating substrate and connected to a signal line; and
a relay electrode connected to the switching element;
a first color filter disposed above the insulating substrate;
a second color filter disposed alongside the first color filter; and
a partition disposed on the signal line and between the first color filter and the second color filter;
a first transparent electrode in contact with upper surfaces of the first and second color filters:
an interlayer insulating film disposed on the first transparent electrode; and
a second transparent electrode disposed on the interlayer insulating film, wherein
an upper surface of the partition and the upper surfaces of the first and second color filters are located on a same plane, and
the second color filter comprises a contact hole penetrating to the relay electrode.

11. The display device of claim 10, wherein
the first transparent electrode is electrically connected to the relay electrode via the contact hole.

12. The display device of claim 10, wherein
the second transparent electrode is electrically connected to the relay electrode via the contact hole.

\* \* \* \* \*